United States Patent
Lu et al.

(10) Patent No.: US 9,704,919 B1
(45) Date of Patent: Jul. 11, 2017

(54) HIGH ASPECT RATIO VERTICAL INTERCONNECT ACCESS (VIA) INTERCONNECTIONS IN MAGNETIC RANDOM ACCESS MEMORY (MRAM) BIT CELLS

(71) Applicant: QUALCOMM Incorporated, San Diego, CA (US)

(72) Inventors: Yu Lu, San Diego, CA (US); Wei-Chuan Chen, San Diego, CA (US); Jimmy Jianan Kan, San Diego, CA (US); Seung Hyuk Kang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/192,068

(22) Filed: Jun. 24, 2016

(51) Int. Cl.
*H01L 29/66* (2006.01)
*H01L 27/22* (2006.01)
(Continued)

(52) U.S. Cl.
CPC ........ *H01L 27/228* (2013.01); *H01L 21/0273* (2013.01); *H01L 21/288* (2013.01); *H01L 21/28556* (2013.01); *H01L 21/31111* (2013.01); *H01L 21/3212* (2013.01); *H01L 21/7684* (2013.01); *H01L 21/76802* (2013.01);
(Continued)

(58) Field of Classification Search
CPC ........... H01L 21/0273; H01L 21/28556; H01L 21/288; H01L 21/31111; H01L 21/3212; H01L 21/76802; H01L 21/76879; H01L 23/5226; H01L 23/528; H01L 43/02; H01L 43/08; H01L 43/12
See application file for complete search history.

(56) References Cited

U.S. PATENT DOCUMENTS 7,153,775 B2   12/2006   Geusic et al.
8,372,757 B2   2/2013    Mayer et al.
(Continued)

OTHER PUBLICATIONS

Author Unknown, "New Approach to Pave the Way for Advanced Interconnects Enabling Future Technology Nodes," IMEC News, May 19, 2015, IMEC, 2 pages, http://www2.imec.be/be_en/press/imec-news/imeccoeld1.html.

*Primary Examiner* — Yosef Gebreyesus
(74) *Attorney, Agent, or Firm* — Withrow & Terranova, PLLC

(57) ABSTRACT

High aspect ratio vertical interconnect access (via) interconnections in magnetic random access memory (MRAM) bit cells are disclosed. In one aspect, an exemplary MRAM bit cell includes a coupling column interconnecting an access transistor and a magnetic tunnel junction (MTJ) therein. The coupling column is disposed across a plurality of interconnection layers. In one aspect, the coupling column comprises a high aspect ratio via. In another aspect, the high aspect ratio via is connected directly between a drain contact coupled to a drain of the access transistor and to an end electrode of the MTJ such that no interconnection line and/or interconnection island is provided in the coupling column. In certain aspects, the coupling column may be disposed between an interconnection line and an adjacent interconnection line without increasing an existing interconnection line pitch, thus allowing for a reduction in MRAM bit cell pitch.

20 Claims, 17 Drawing Sheets

(51) Int. Cl.
  *H01L 43/02* (2006.01)
  *H01L 43/08* (2006.01)
  *H01L 23/528* (2006.01)
  *H01L 23/522* (2006.01)
  *H01L 43/12* (2006.01)
  *H01L 21/768* (2006.01)
  *H01L 21/027* (2006.01)
  *H01L 21/311* (2006.01)
  *H01L 21/321* (2006.01)
  *H01L 21/285* (2006.01)
  *H01L 21/288* (2006.01)

(52) U.S. Cl.
  CPC ...... *H01L 21/76879* (2013.01); *H01L 23/528* (2013.01); *H01L 23/5226* (2013.01); *H01L 43/02* (2013.01); *H01L 43/08* (2013.01); *H01L 43/12* (2013.01)

(56) References Cited

U.S. PATENT DOCUMENTS

| | | |
|---|---|---|
| 8,503,223 B2 | 8/2013 | Shuto |
| 9,042,166 B2 | 5/2015 | Toko et al. |
| 2005/0072997 A1* | 4/2005 | Kikuchi ............... H01L 27/228 257/295 |
| 2011/0122674 A1* | 5/2011 | Lin ..................... G11C 11/16 365/145 |
| 2012/0056253 A1 | 3/2012 | Iwayama et al. |
| 2014/0119109 A1 | 5/2014 | Nagase et al. |
| 2014/0328116 A1 | 11/2014 | Guo |
| 2015/0287910 A1* | 10/2015 | Lu ........................ H01L 43/02 257/421 |

* cited by examiner

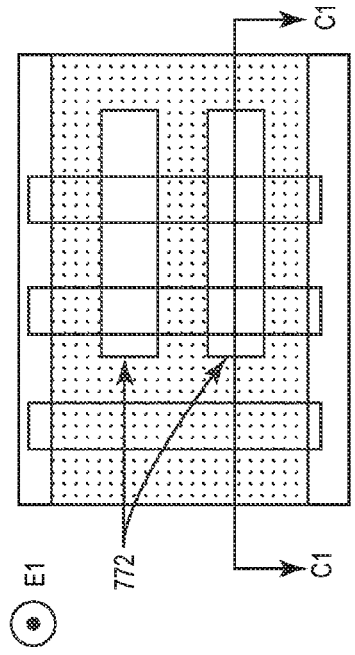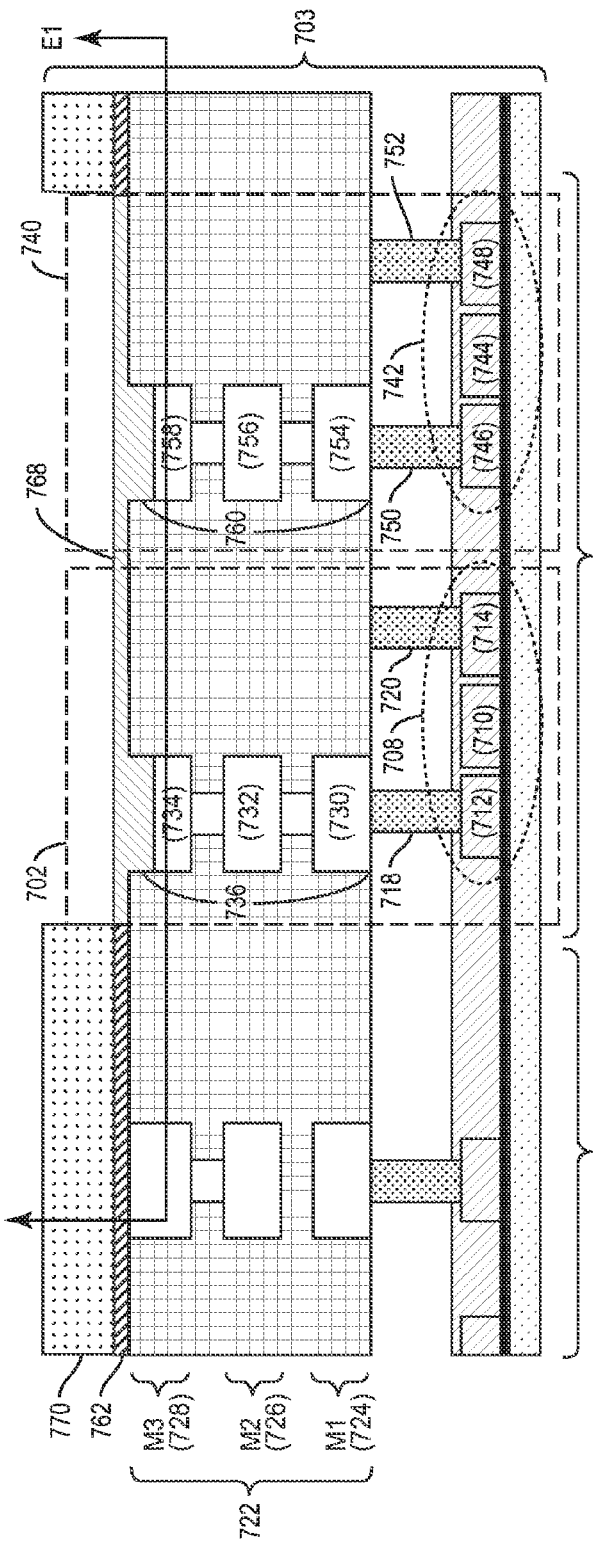

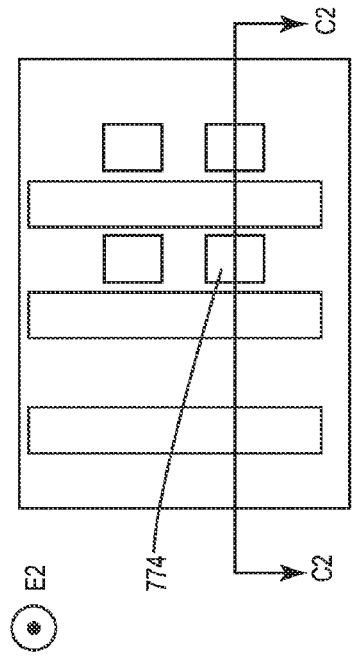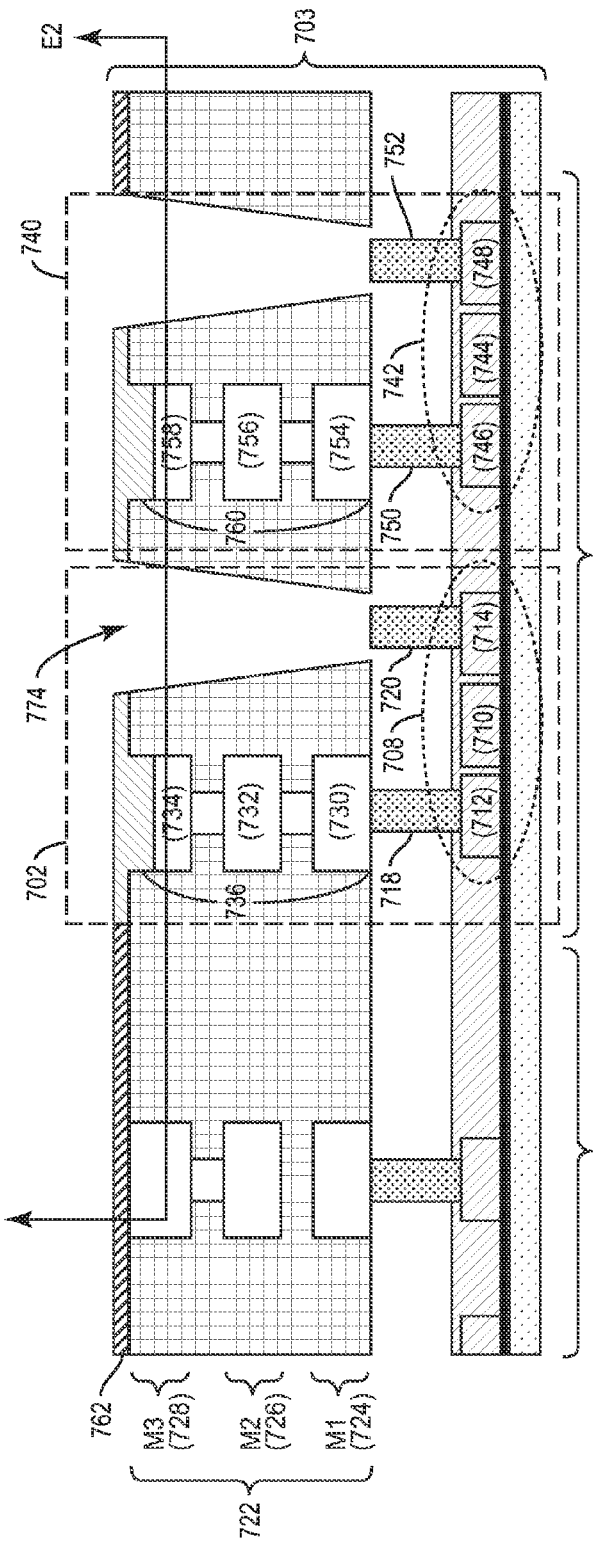
FIG. 7H
FIG. 7G

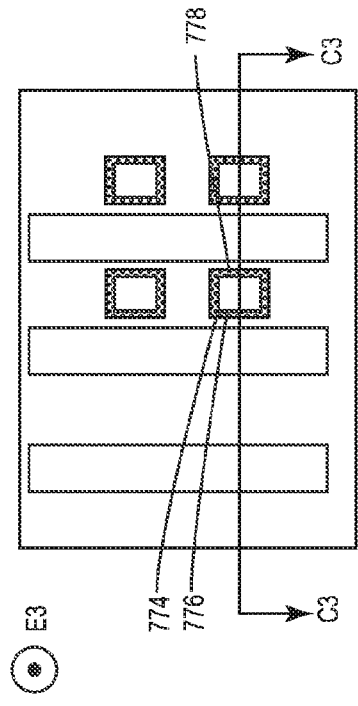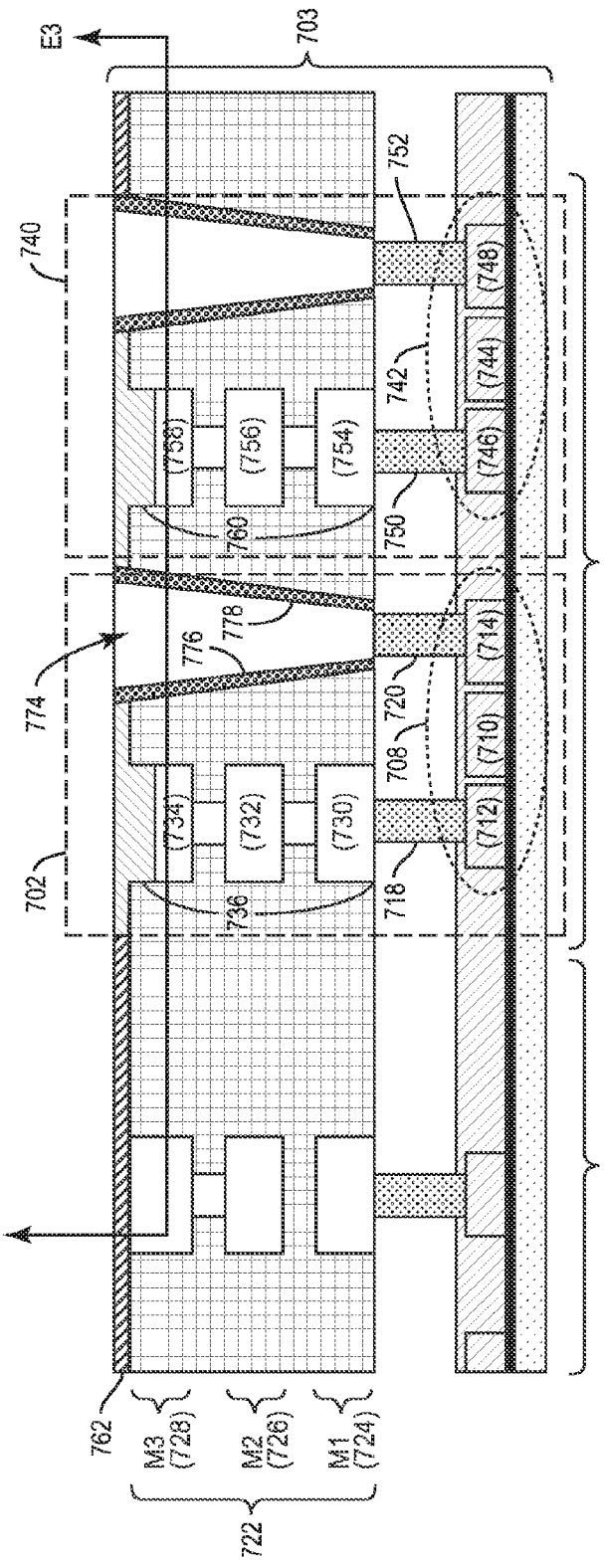

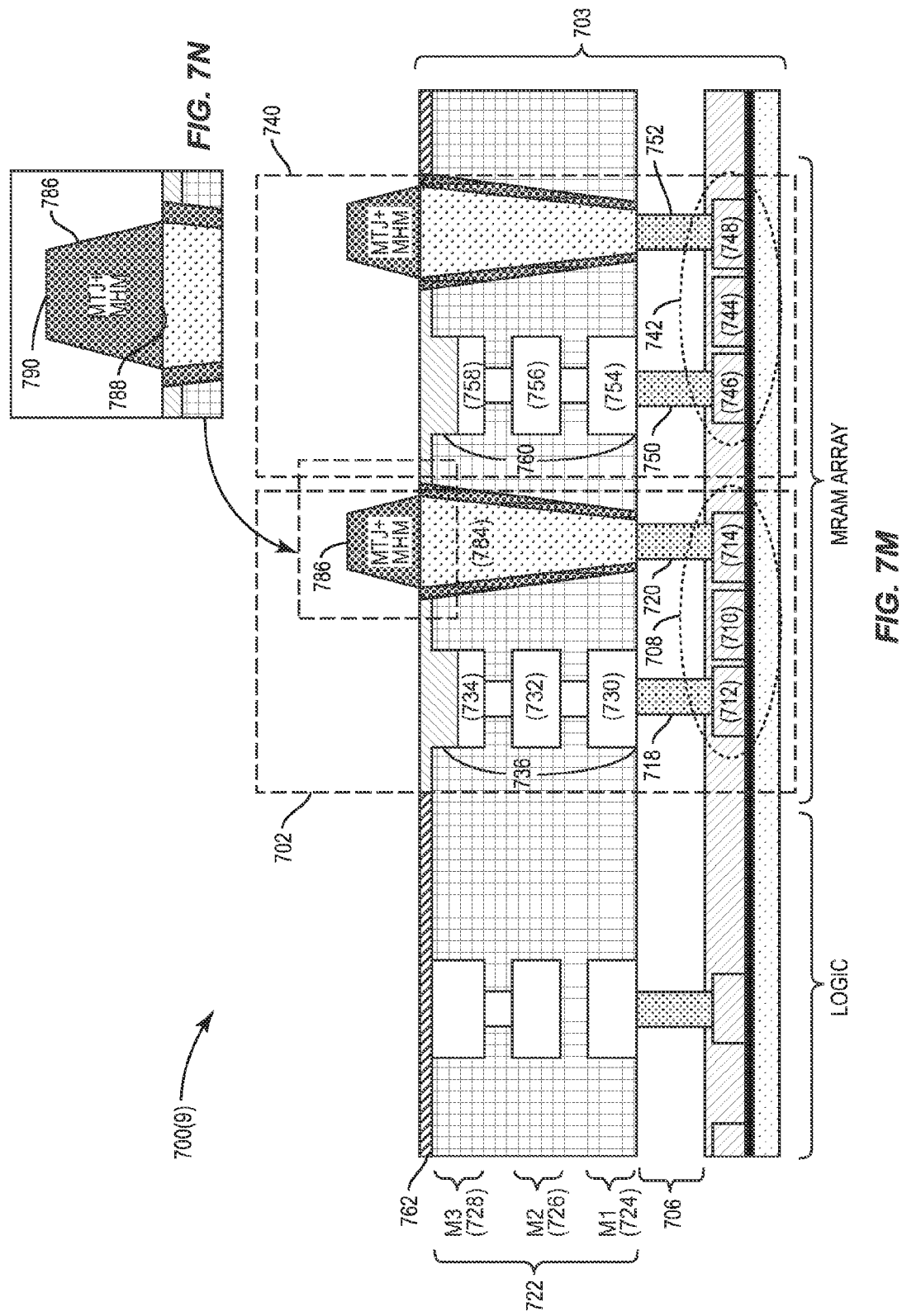

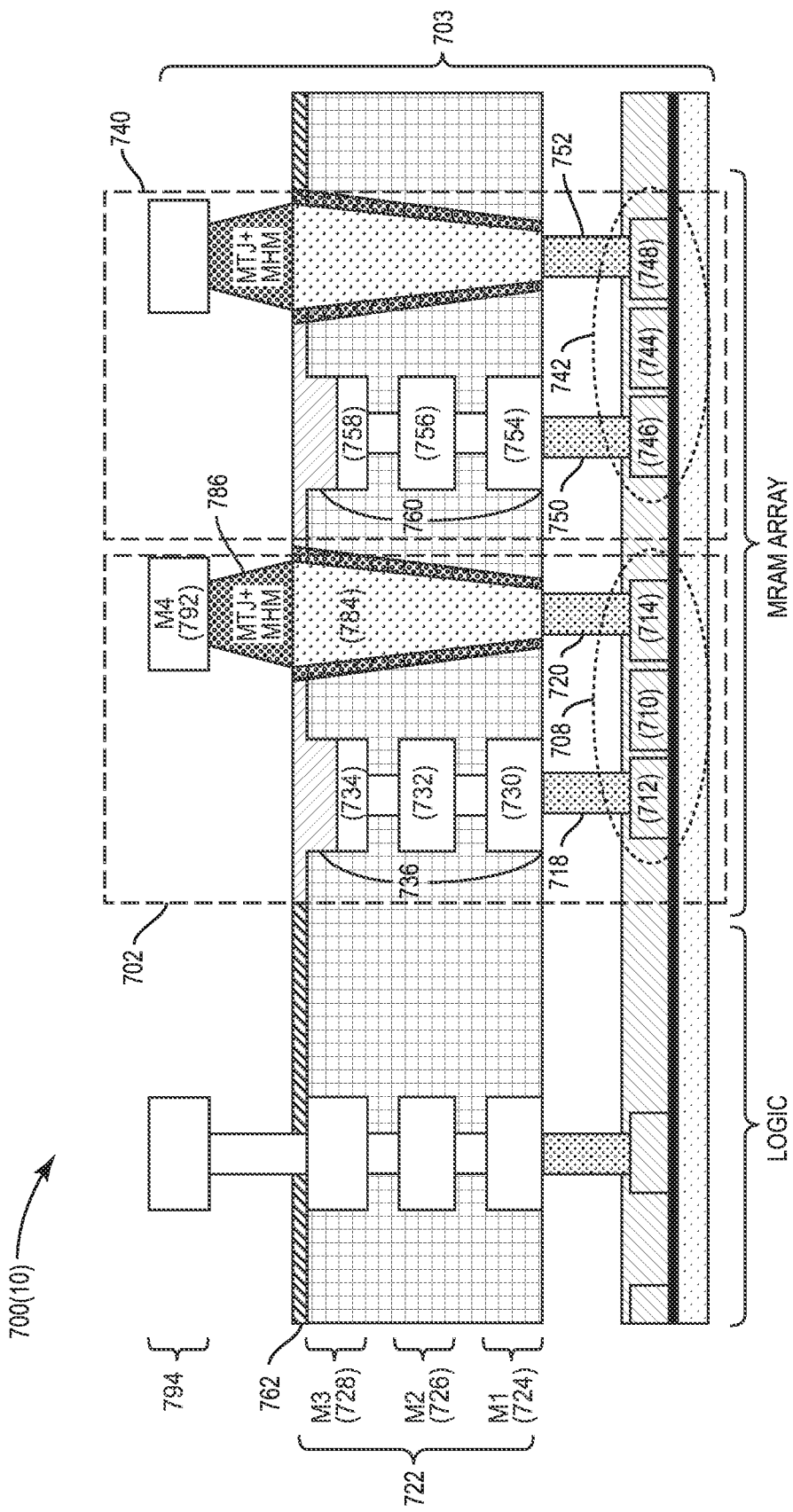

HIGH ASPECT RATIO VERTICAL INTERCONNECT ACCESS (VIA) INTERCONNECTIONS IN MAGNETIC RANDOM ACCESS MEMORY (MRAM) BIT CELLS

BACKGROUND

I. Field of the Disclosure

The technology of the disclosure relates generally to magnetic random access memory (MRAM) bit cells and, more particularly, to the interconnection between a magnetic tunnel junction (MTJ) and an access transistor of the MRAM bit cells.

II. Background

Semiconductor storage devices are used in integrated circuits (ICs) in electronic devices to provide data storage. One example of a semiconductor storage device is magnetic random access memory (MRAM). MRAM is non-volatile memory in which data is stored by programming a magnetic tunnel junction (MTJ) as part of an MRAM bit cell. One advantage of an MRAM is that MTJs can retain stored information even when power is turned off. This is because data is stored in the MTJ as a small magnetic element rather than as an electric charge or current.

FIG. 1 is a schematic diagram of an MRAM bit cell 100 including an MTJ 102 to store non-volatile data that can be provided in an MRAM array in an IC. A metal oxide semiconductor (MOS) (typically n-type MOS, i.e., NMOS) access transistor 104 ("access transistor 104") is provided to control reading and writing to the MTJ 102. A drain node (D) of the access transistor 104 is coupled to a bottom electrode 106 of the MTJ 102, which is coupled to a pinned layer 108 of the MTJ 102. A word line (WL) is coupled to a gate node (G) of the access transistor 104. A source node (S) of the access transistor 104 is coupled to a voltage source ($V_S$) through a source line (SL). The voltage source ($V_S$) provides a voltage ($V_{SL}$) on the source line (SL). A bit line (BL) is coupled to a top electrode 110 of the MTJ 102, which is coupled to a free layer 112 of the MTJ 102. The pinned layer 108 and the free layer 112 are separated by a tunnel barrier layer 114. The magnetic orientation of the free layer 112 can be changed, but the magnetic orientation of the pinned layer 108 remains fixed or "pinned." Accordingly, data can be stored in the MTJ 102 based on the magnetic orientation of the free layer 112. When the magnetic orientations of the pinned and free layers 108, 112 are anti-parallel (AP) to each other, a first memory state exists (e.g., a logical '1'). When the magnetic orientations of the pinned and free layers 108, 112 are parallel (P) to each other, a second memory state exists (e.g., a logical '0').

When writing data to the MTJ 102 in FIG. 1, the gate node (G) of the access transistor 104 is activated by activating the word line (WL). A voltage differential between a voltage ($V_{BL}$) on the bit line (BL) and the voltage ($V_{SL}$) on the source line (SL) is applied. As a result, a write current (I) is generated between the drain node (D) and the source node (S) of the access transistor 104. If the magnetic orientation of the MTJ 102 in FIG. 1 is to be changed from AP to P, a write current ($I_{AP-P}$) flowing from the top electrode 110 to the bottom electrode 106 is generated to change the magnetic orientation of the free layer 112 to P with respect to the pinned layer 108. If the magnetic orientation is to be changed from P to AP, a write current ($I_{P-AP}$) flowing from the bottom electrode 106 to the top electrode 110 is generated to change the magnetic orientation of the free layer 112 to AP with respect to the pinned layer 108. The magnetic orientations of the pinned and free layers 108, 112 can be sensed to read data stored in the MTJ 102 by sensing a resistance when the write current (I) flows through the MTJ 102.

Advances in fabrication processes allow nodes to be scaled down to reduce chip area and/or increase the number of semiconductor devices in an IC. However, fabrication process limitations may limit scaling down interconnections (lines or islands) in an IC. For example, in an IC including the MRAM bit cell 100, the access transistor 104 is conventionally disposed in an active area at or near a substrate of the IC. The MTJ 102 is conventionally disposed at a high interconnection layer (e.g., metal layer) of the IC to facilitate an external connection in the IC for the bit line (BL). Thus, the bottom electrode 106 is interconnected to the drain node (D) of the access transistor 104 by a drain column that includes a plurality of intermediate interconnections (lines or islands), of corresponding interconnection layers. These interconnections (lines or islands) are conventionally formed by a lithography process on corresponding interconnection layers. However, due to limitations in lithography processes, each interconnection line and/or island requires a minimum area, and separation from adjacent interconnections (lines or islands) by a minimum distance. Accordingly, a resulting interconnection line pitch (i.e., the distance from a center of an interconnection (line or island) to a center of an adjacent interconnection (line or island)) limits the number of interconnections (lines or islands) that can be formed in an IC, and therefore limits the number of interconnection paths to interconnect semiconductor devices therein. Thus, although advanced fabrication processes may reduce the size of semiconductor elements in an IC, such as transistors, limitations associated with forming interconnections (lines or islands) to interconnect semiconductor elements and devices can limit the number of semiconductor devices that can be interconnected in the IC and, therefore, also limit further scaling down devices, such as the MRAM bit cell 100 in FIG. 1.

SUMMARY OF THE DISCLOSURE

Aspects disclosed in the detailed description include high aspect ratio vertical interconnect access (via) interconnections in magnetic random access memory (MRAM) bit cells. Advances in integrated circuit (IC) fabrication allow for a reduction in the distance between a drain and a source of transistors in an active semiconductor area, which may be used to reduce the size of an MRAM array. However, conventional MRAM bit cells of the MRAM array may rely on interconnection lines (e.g., metal lines) and/or islands (e.g., metal islands) disposed across a plurality of interconnection layers for internal connections and for connections to elements of the MRAM array. For example, a conventional MRAM bit cell includes an access transistor for reading and writing data, and a magnetic tunnel junction (MTJ) for storing the data. In this regard, the conventional MRAM bit cell may rely on an interconnection line as a source line, and on an interconnection island adjacent to the interconnection line to interconnect a drain of the access transistor to the MTJ. Thus, the conventional MRAM bit cell can employ at least two adjacent interconnections to operate within the MRAM array. Accordingly, in the conventional MRAM bit cell, an interconnection line pitch (i.e., the distance from a center of an interconnection (line or island) to a center of an adjacent interconnection (line or island)) may limit an MRAM bit cell pitch (i.e., the distance from a center of an MRAM bit cell to the center of an adjacent MRAM bit cell). For example, because the conventional MRAM bit cell employs at least two adjacent interconnections (lines or islands), the conventional MRAM bit cell pitch is that of the at least two adjacent interconnections, or at least twice that of the interconnection line pitch.

In this regard, exemplary MRAM bit cells disclosed herein include a coupling column interconnecting an access transistor of the MRAM bit cell and an MTJ of the MRAM bit cell. The coupling column is disposed across a plurality of interconnection layers in an IC. In an exemplary aspect, the coupling column comprises a high aspect ratio via. In another exemplary aspect, the high aspect ratio via is connected directly between a drain contact coupled to a drain of the access transistor and an end electrode of the MTJ such that no other interconnection (line or island) is provided in the coupling column. The high aspect ratio via allows the coupling column to be disposed between adjacent interconnections without increasing an existing interconnection line pitch, thus allowing for a reduction in MRAM bit cell pitch despite existing interconnection line pitch fabrication limitations. For example, in certain aspects, up to a fifty (50) percent reduction in MRAM bit cell pitch can be achieved.

Furthermore, in the conventional MRAM bit cell, vertical interconnections (i.e., coupling of vertically adjacent interconnections (line or islands)) are implemented through interconnection vias. However, interconnection via misalignment, which may occur due to fabrication limitations, can affect interconnection resistance. Furthermore interconnection via misalignment can cause a via-metal short between adjacent interconnections (lines or islands). In this regard, in certain aspects, the coupling column is disposed in a self-aligned process flow and without reliance on interconnection vias. Accordingly, in an exemplary aspect, the resistance and the possibility of a via-metal short associated with interconnection via misalignment in the conventional MRAM bit cell is obviated.

In this regard in one aspect, an MRAM bit cell is provided. The MRAM bit cell comprises a substrate and an active semiconductor layer disposed above the substrate. The active semiconductor layer comprises an access transistor comprising a gate, a source, and a drain. The MRAM bit cell further comprises a source contact coupled to the source of the access transistor, and a drain contact coupled to the drain of the access transistor. The MRAM bit cell further comprises a dielectric layer comprising a plurality of interconnection layers disposed above the active semiconductor layer. Each interconnection layer comprises at least one interconnection line. The MRAM bit cell further comprises a source line comprising an interconnection line of a first interconnection layer of the plurality of interconnection layers, wherein the source line is coupled to the source contact. The MRAM bit cell further comprises an MTJ coupling column disposed across at least two interconnection layers of the plurality of interconnection layers between the drain contact and an MTJ. The MTJ coupling column comprises a via coupling a first end electrode of the MTJ to the drain contact without coupling to any interconnection lines in the at least two interconnection layers. The MTJ comprises a tunnel junction disposed between the first end electrode and a second end electrode. The MRAM bit cell further comprises a bit line comprising an interconnection line of a second interconnection layer of the plurality of interconnection layers. The bit line is coupled to the second end electrode of the MTJ.

In another aspect, an MRAM bit cell array is provided. The MRAM bit cell array comprises a plurality of MRAM bit cells, each MRAM bit cell comprising a substrate and an active semiconductor layer disposed above the substrate. The active semiconductor layer comprises an access transistor comprising a gate, a source, and a drain. Each MRAM bit cell further comprises a source contact coupled to the source of the access transistor, and a drain contact coupled to the drain of the access transistor. Each MRAM bit cell further comprises a dielectric layer comprising a plurality of interconnection layers disposed above the active semiconductor layer. Each interconnection layer comprises at least one interconnection line. Each MRAM bit cell further comprises a source line comprising an interconnection line of a first interconnection layer of the plurality of interconnection layers. The source line is coupled to the source contact. Each MRAM bit cell further comprises an MTJ coupling column disposed across at least two interconnection layers of the plurality of interconnection layers between the drain contact and an MTJ. The MTJ coupling column comprises a via coupling a first end electrode of the MTJ to the drain contact without coupling to any interconnection lines in the at least two interconnection layers. The MTJ comprises a tunnel junction disposed between the first end electrode and a second end electrode. Each MRAM bit cell further comprises a bit line comprising an interconnection line of a second interconnection layer of the plurality of interconnection layers. The bit line is coupled to the second end electrode of the MTJ. In the MRAM bit cell array, a via of a first MRAM bit cell of the plurality of MRAM bit cells is disposed between a source line of the first MRAM bit cell of the plurality of MRAM bit cells and a source line of a second MRAM bit cell of the plurality of MRAM bit cells disposed adjacent to the first MRAM bit cell. Furthermore, in the MRAM bit cell array, the source line of the first MRAM bit cell and the source line of the second MRAM bit cell are separated by an interconnection line pitch.

In another aspect, a method of fabricating a high aspect ratio via in an IC is provided. The method comprises providing an IC comprising a substrate and an active semiconductor layer disposed above the substrate. The active semiconductor layer comprises an access transistor comprising a gate, a source, and a drain. The IC further comprises a source contact coupled to the source of the access transistor, and a drain contact coupled to the drain of the access transistor. The IC further comprises a dielectric layer comprising a plurality of interconnection layers disposed above the active semiconductor layer. Each interconnection layer comprises at least one interconnection line. The IC further comprises a source line comprising an interconnection line of a first interconnection layer of the plurality of interconnection layers. The source line is coupled to the source contact. The method further comprises forming a via opening in the dielectric layer down to the drain contact to expose the drain contact. The method further comprises filling the via opening with a conductive material. The method further comprises forming an MTJ above the conductive material. The method further comprises forming a bit line above the MTJ.

DETAILED DESCRIPTION

Figure 1:
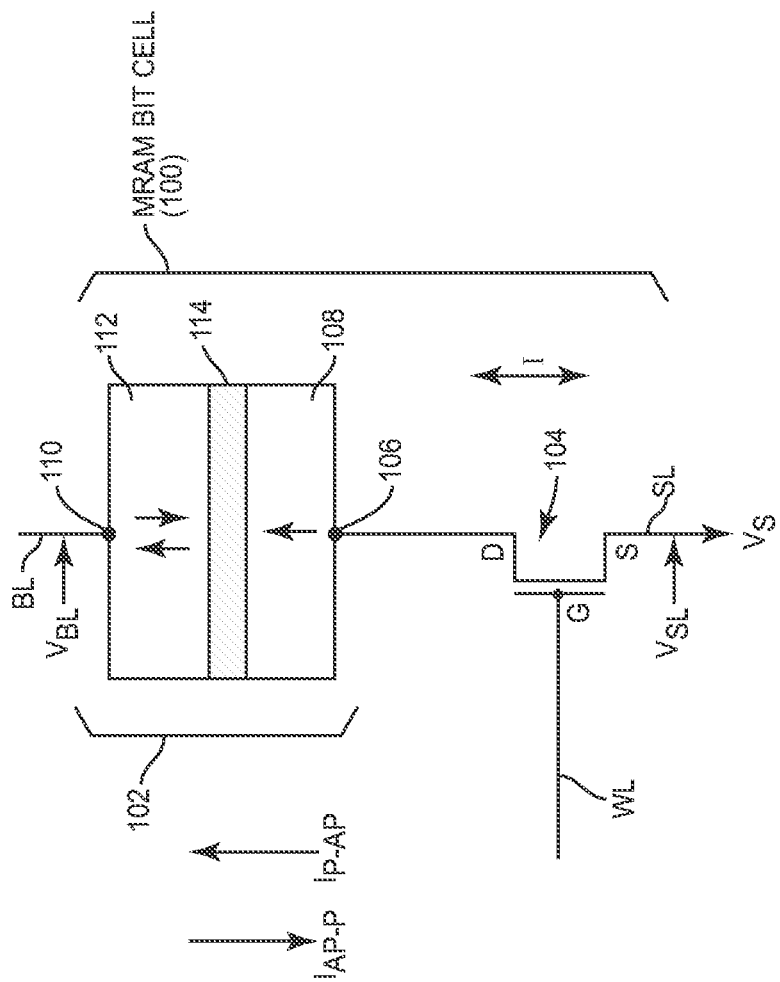
FIG. 1 is a schematic diagram of a magnetic random access memory (MRAM) bit cell including a magnetic tunnel junction (MTJ) that can be provided in an MRAM bit cell array in an integrated circuit (IC)

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed in the detailed description include high aspect ratio vertical interconnect access (via) interconnections in magnetic random access memory (MRAM) bit cells. Advances in integrated circuit (IC) fabrication allow for a reduction in the distance between a drain and a source of transistors in an active semiconductor area, which may be used to reduce the size of an MRAM array. However, conventional MRAM bit cells of the MRAM array may rely on interconnection lines (e.g., metal lines) and/or islands (e.g., metal islands) disposed across a plurality of interconnection layers for internal connections and for connections to elements of the MRAM array. For example, a conventional MRAM bit cell includes an access transistor for reading and writing data, and a magnetic tunnel junction (MTJ) for storing the data. In this regard, the conventional MRAM bit cell may rely on an interconnection line as a source line, and on an interconnection island adjacent to the interconnection line to interconnect a drain of the access transistor to the MTJ. Thus, the conventional MRAM bit cell can employ at least two adjacent interconnections to operate within the MRAM array. Accordingly, in the conventional MRAM bit cell, an interconnection line pitch (i.e., the distance from a center of an interconnection (line or island) to a center of an adjacent interconnection (line or island)) may limit an MRAM bit cell pitch (i.e., the distance from a center of an MRAM bit cell to the center of an adjacent MRAM bit cell). For example, because the conventional MRAM bit cell employs at least two adjacent interconnections (lines or islands), the conventional MRAM bit cell pitch is that of the at least two adjacent interconnections, or at least twice that of the interconnection line pitch.

In this regard, exemplary MRAM bit cells disclosed herein include a coupling column interconnecting an access transistor of the MRAM bit cell and an MTJ of the MRAM bit cell. The coupling column is disposed across a plurality of interconnection layers in an IC. In an exemplary aspect, the coupling column comprises a high aspect ratio via. In another exemplary aspect, the high aspect ratio via is connected directly between a drain contact coupled to a drain of the access transistor and an end electrode of the MTJ such that no other interconnection (line or island) is provided in the coupling column. The high aspect ratio via allows the coupling column to be disposed between adjacent interconnections without increasing an existing interconnection line pitch, thus allowing for a reduction in MRAM bit cell pitch despite existing interconnection line pitch fabrication limitations. For example, in certain aspects, up to a fifty (50) percent reduction in MRAM bit cell pitch can be achieved.

Furthermore, in the conventional MRAM bit cell, vertical interconnections (i.e., coupling of vertically adjacent interconnections (line or islands)) are implemented through interconnection vias. However, interconnection via misalignment, which may occur due to fabrication limitations, can affect interconnection resistance. Furthermore interconnection via misalignment can cause a via-metal short between adjacent interconnections (lines or islands). In this regard, in certain aspects, the coupling column is disposed in a self-aligned process flow and without reliance on interconnection vias. Accordingly, in an exemplary aspect, the resistance and the possibility of a via-metal short associated with interconnection via misalignment in the conventional MRAM bit cell is obviated.

Figure 2:
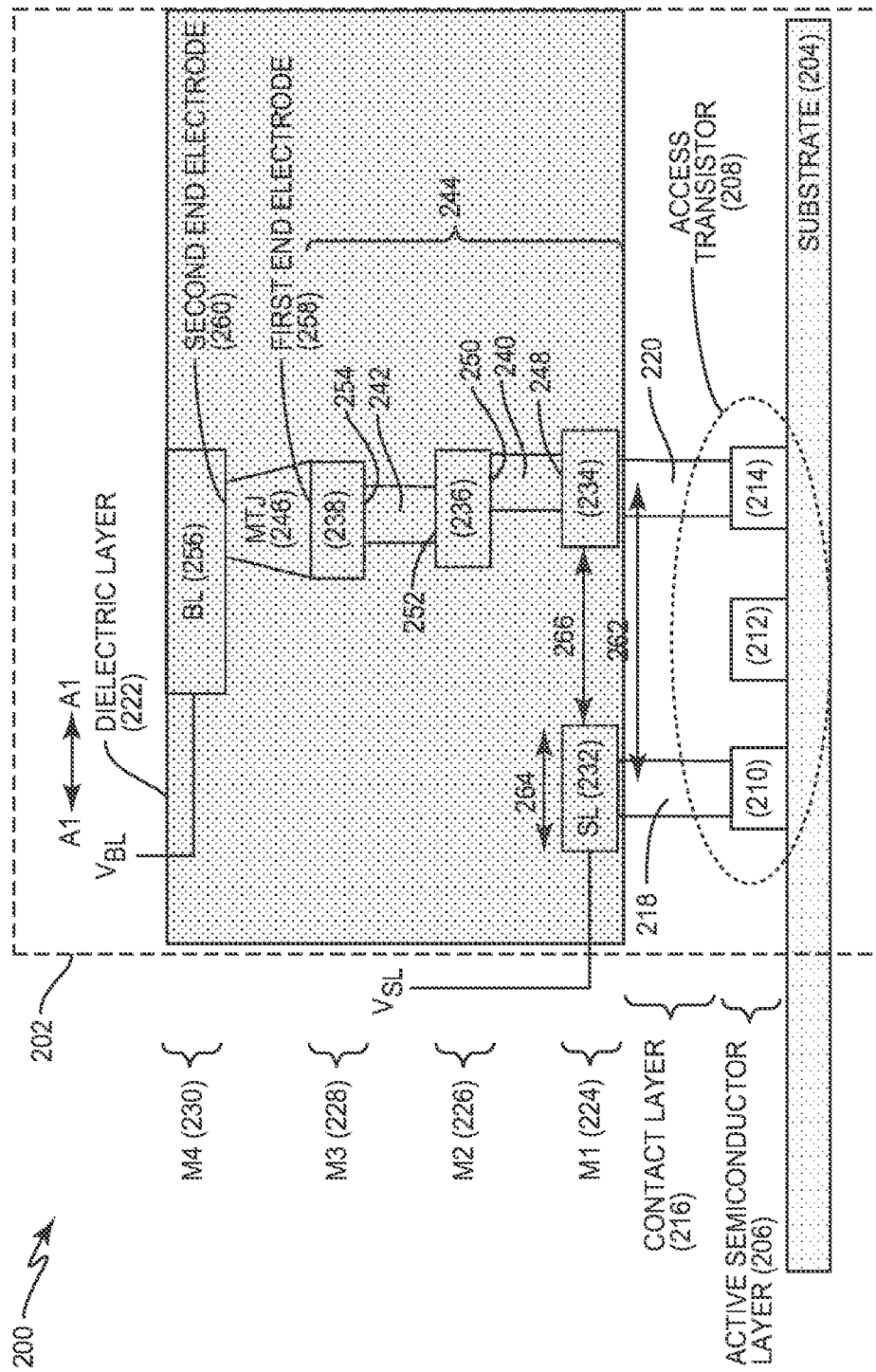
FIG. 2 is a side view of a layout of a conventional MRAM bit cell of an MRAM bit cell array.

Before turning to exemplary aspects, a layout of an MRAM bit cell will be described. In this regard, FIG. 2 is a side view of a layout 200 of a conventional MRAM bit cell 202 across an A1-A1 line. The MRAM bit cell 202 includes a substrate 204 and an active semiconductor layer 206 disposed on the substrate 204. The active semiconductor layer 206 includes an access transistor 208 that includes a source 210, a gate 212, and a drain 214. The MRAM bit cell 202 further includes a contact layer 216 that includes a source contact 218 and a drain contact 220.

The MRAM bit cell 202 further includes a dielectric layer 222 comprising a first metal interconnection layer (M1) 224, a second metal interconnection layer (M2) 226, a third metal interconnection layer (M3) 228, and a fourth metal interconnection layer (M4) 230, in which interconnections (lines or islands) are disposed to establish interconnection paths between semiconductor elements therein. In this regard, an interconnection line 232 is disposed in the first metal interconnection layer (M1) 224 to provide a source line (SL) to the MRAM bit cell 202. In particular, the interconnection line 232 is disposed in contact with the source contact 218 to interconnect the source 210 of the access transistor 208 of the MRAM bit cell 202 to a source line (SL) of the corresponding MRAM array (not shown). Furthermore, interconnection islands 234, 236, and 238 are disposed in the first metal interconnection layer (M1) 224, the second metal interconnection layer (M2) 226, and the third metal interconnection layer (M3) 228, respectively, to provide vertical interconnections within the MRAM bit cell 202. In particular, the interconnection islands 234, 236, 238 are interconnected by interconnection vias 240, 242 to provide a drain column 244 that electrically couples the drain 214 of the access transistor 208 of the MRAM bit cell 202 to an MTJ 246 disposed higher in the MRAM bit cell 202. In particular, the interconnection via 240 interconnects with the interconnection islands 234 and 236 at interfaces 248 and 250, respectively, to interconnect the interconnection islands 234 and 236. Furthermore, the interconnection via 242 interconnects with the interconnection islands 236 and 238 at interfaces 252 and 254, respectively, to interconnect the interconnection islands 236 and 238. Furthermore, an interconnection line 256 is disposed in the fourth metal interconnection layer (M4) 230, and is coupled to the MTJ 246 to provide a bit line (BL) to the MRAM bit cell 202. The MTJ 246 includes a first end electrode 258 coupled to the interconnection island 238 and a second end electrode 260 coupled to the interconnection line 256. In operation, the MRAM bit cell 202 operates as the MRAM bit cell 100 illustrated in FIG. 1, and further description is therefore omitted herein.

The fabrication process employed to dispose interconnections, such as the interconnection line 232 and the interconnection islands 234, 236, 238, has several limitations that prevent scaling down of the MRAM bit cell 202. For example, fabrication limitations in a lithography process employed to dispose interconnection line 232 and the interconnection island 234 provide a minimum interconnection line pitch 262. Furthermore, fabrication limitations in the lithography process also provide a minimum width 264 for interconnections therein (the width 264 is illustrated for the interconnection line 232 only, for clarity). Thus, the pitch 262 and the width 264 result in a minimum separation 266 between the interconnection line 232 and the adjacent interconnection island 234.

Figure 3:
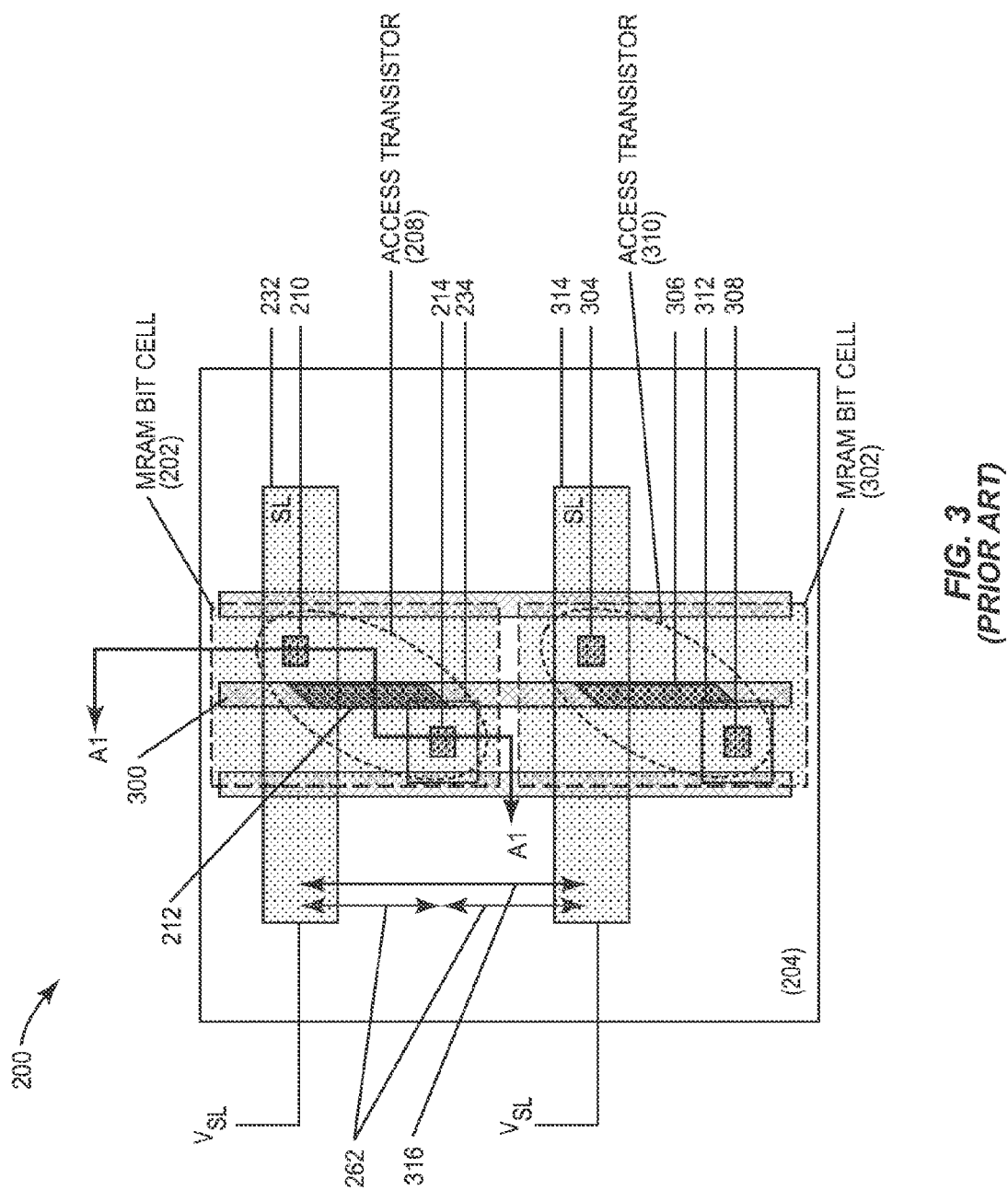
FIG. 3 is a top view of the layout of the conventional MRAM bit cell illustrated in FIG. 2.

To further illustrate characteristics of the MRAM bit cell 202, FIG. 3 is provided. FIG. 3 is a top view of the layout 200 of the MRAM bit cell 202 illustrated in FIG. 2. In particular, FIG. 3 illustrates the A1-A1 cross section line corresponding to the side view provided in FIG. 2. In this regard, FIG. 3 illustrates the source 210, the gate 212, and the drain 214 of the access transistor 208, the gate 212 provided in the form of a word line (WL) 300. FIG. 3 further illustrates elements of an adjacent MRAM bit cell 302 disposed on the substrate 204. For example, FIG. 3 illustrates a source 304, a gate 306, and a drain 308 of an access transistor 310 of the adjacent MRAM bit cell 302. Furthermore, FIG. 3 illustrates an interconnection island 312 and an interconnection line 314 to provide a source line (SL) to the adjacent MRAM bit cell 302. Furthermore, FIG. 3 illustrates the interconnection line pitch 262 between the interconnection line 232 and the interconnection island 234 in the MRAM bit cell 202.

Although advances in fabrication may make it possible to reduce the size of the access transistor 208 by disposing the drain 214 closer to the source 210, scaling down of the MRAM bit cell 202 is limited by the interconnection line pitch 262. In particular, the MRAM bit cell 202 needs at least two interconnections to connect to the access transistor 208 (i.e., the interconnection line 232 and the interconnection island 234). Accordingly, an MRAM bit cell pitch 316 (i.e., the distance from a center of the MRAM bit cell 202 to a center of the adjacent MRAM bit cell 302) is at least twice the interconnection line pitch 262 therein.

Figure 4:
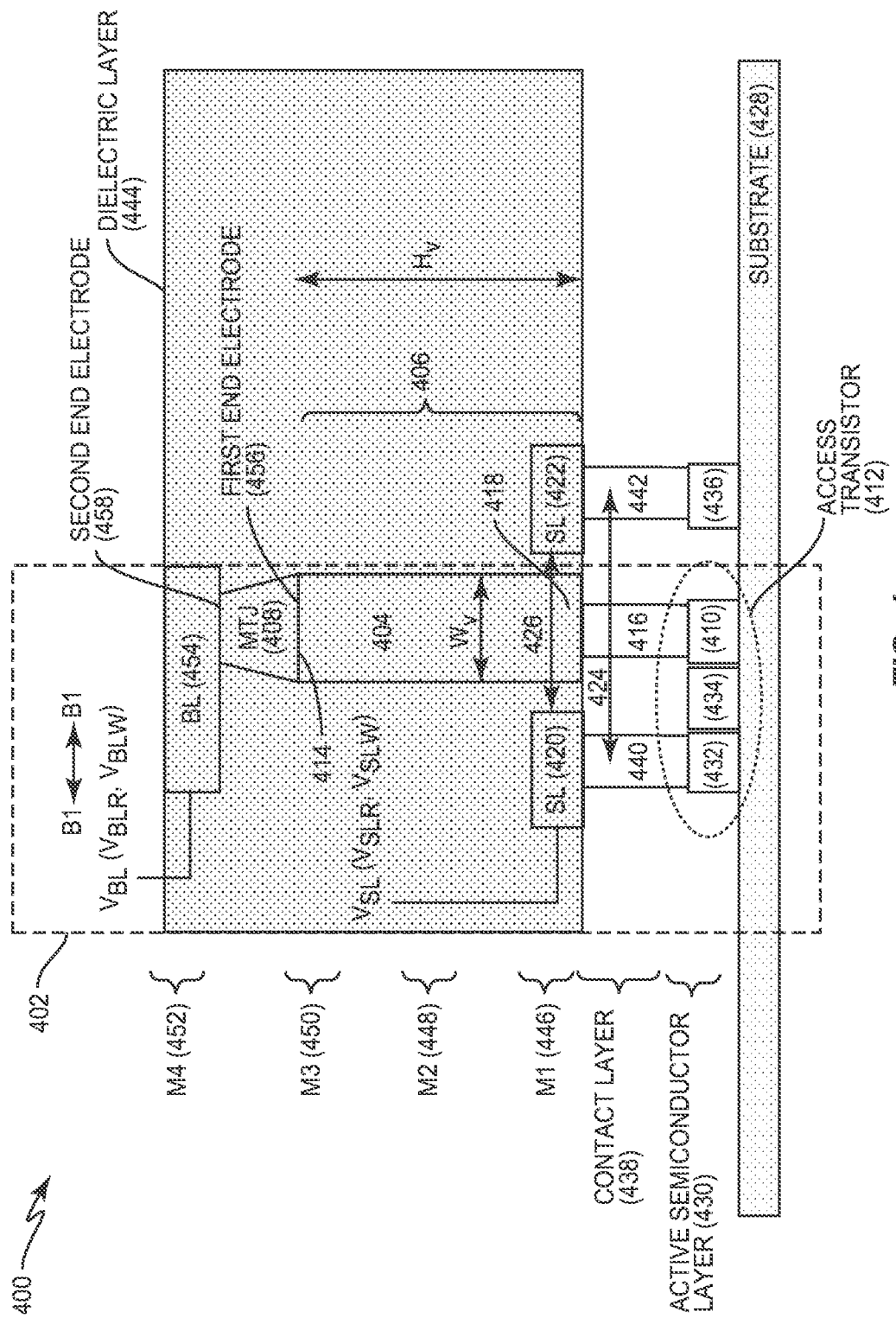
FIG. 4 is a side view of a layout of an exemplary MRAM bit cell including a high aspect ratio vertical interconnect access (via) interconnection to provide a high density MRAM bit cell that can be provided in an MRAM bit cell array in an IC.

FIG. 4 is a side view of a layout 400 of an exemplary MRAM bit cell 402 including a high aspect ratio via interconnection to provide a high density MRAM bit cell that can be provided in an MRAM bit cell array in an IC. The MRAM bit cell 402 includes a high aspect ratio via 404 that provides an MTJ coupling column 406 to interconnect an MTJ 408 to a drain 410 of an access transistor 412. The high aspect ratio via 404 has, for example, a height-to-width (Hv-to-Wv) aspect ratio of at least ten (10). Furthermore, the high aspect ratio via 404 has a top end 414 that is coupled to the MTJ 408 disposed above the high aspect ratio via 404. In one aspect, the top end 414 of the high aspect ratio via 404 is directly connected to the MTJ 408. Furthermore, the high aspect ratio via 404 is disposed above a drain contact 416, and has a bottom end 418 that is coupled to the drain contact 416. In one aspect, the bottom end 418 of the high aspect ratio via 404 is directly connected to the drain contact 416. Furthermore, the high aspect ratio via 404 is disposed between an interconnection line 420 and an interconnection line 422. The interconnection line 420 provides a source line (SL) to the exemplary MRAM bit cell 402, and the interconnection line 422 provides a source line (SL) to an adjacent MRAM bit cell (not shown).

It is noted that the MRAM bit cell 402 is subject to the same lithography process limitations as the MRAM bit cell 202 illustrated in FIG. 2. Accordingly, an interconnection line pitch 424 between the interconnection lines 420 and 422 is the same as the interconnection line pitch 262 between the interconnection line 232 and the interconnection island 234 illustrated in FIG. 2. Furthermore, a minimum separation 426 between the interconnection lines 420 and 422 is the same as the minimum separation 266 between the interconnection line 232 and the interconnection island 234 illustrated in FIG. 2. Accordingly, FIG. 4 illustrates the interconnection line pitch 424 and the minimum separation 426 between the interconnection lines 420 and 422. However, by interconnecting the MTJ 408 to the drain contact 416 of the access transistor 412 with the high aspect ratio via 404, node size is not limited by the interconnection line pitch 424. Furthermore, because the MRAM bit cell 402 uses only one interconnection line (i.e., the interconnection line 420) to connect to the access transistor 412, the interconnection line 422 adjacent to the interconnection line 420 can be employed as the source line (SL) to the adjacent MRAM bit cell (not shown). Accordingly, when the width $W_V$ of the high aspect ratio via 404 is less than the minimum separation 426, such that the high aspect ratio via 404 can be disposed between the interconnection lines 420 and 422 without having to increase the interconnection line pitch 424, twice as many MRAM bit cells 402 than MRAM bit cells 202 can be disposed in a substrate, such as a substrate 428.

The exemplary MRAM bit cell 402 further includes an active semiconductor layer 430 disposed on the substrate 428. The active semiconductor layer 430 includes the access transistor 412 that includes a source 432, a gate 434, and the drain 410. The active semiconductor layer 430 further includes a source 436 of the adjacent MRAM bit cell (not shown). The MRAM bit cell 402 further includes a contact layer 438 that includes a source contact 440, the drain contact 416, and a source contact 442. The source contact 442 corresponds to the adjacent MRAM bit cell (not shown) and couples the source 436 and the interconnection line 422 providing a source line (SL) to the adjacent MRAM bit cell (not shown).

The MRAM bit cell 402 further includes a dielectric layer 444 comprising a first metal interconnection layer (M1) 446, a second metal interconnection layer (M2) 448, a third metal interconnection layer (M3) 450, and a fourth metal interconnection layer (M4) 452, in which interconnections (lines or islands) are disposed to establish interconnection paths between semiconductor devices therein. The interconnection lines 420 and 422 are disposed in the first metal interconnection layer (M1) 446 and, as noted earlier, provide the source line (SL) to the MRAM bit cell 402 and to the adjacent MRAM bit cell (not shown), respectively. An interconnection line 454 is disposed in the fourth metal interconnection layer (M4) 452 coupled to the MTJ 408 to provide a bit line (BL) to the MRAM bit cell 402. The MTJ 408 includes a first end electrode 456 coupled to the high aspect ratio via 404 and a second end electrode 458 coupled to the interconnection line 454. In operation, the MRAM bit cell 402 operates as the MRAM bit cell 100 illustrated in FIG. 1, and further description is therefore omitted herein. For example, a voltage differential between a voltage ($V_{BL}$) on the bit line (BL) and the voltage ($V_{SL}$) on the source line (SL) is applied for read and write operations. In particular, a read voltage on the bit line ($V_{BLR}$) and a source read voltage on the source line ($V_{SLR}$) is applied to read data from the MRAM bit cell 402, and a write voltage on the bit line ($V_{BLW}$) and a source write voltage on the source line ($V_{SLW}$) is applied to read data from the MRAM bit cell 402. The layout 400, therefore, allows the interconnection lines 420, 422 to serve as source lines (SLs) of the MRAM bit cell 402 and of the adjacent MRAM bit cell (not shown), respectively. Accordingly, as will be illustrated in further detail in FIG. 5, the layout 400 provides an MRAM bit cell pitch (not shown) between the adjacent MRAM bit cells that corresponds to the interconnection line pitch 424. Accordingly, the MRAM bit cell pitch (not shown) provided by the layout 400 is half the MRAM bit cell pitch 316 provided by the layout 200 illustrated in FIG. 3. Thus, more MRAM bit cells 402 can be disposed on the substrate 428 compared to the MRAM bit cells 202 that can be disposed on the substrate 204 illustrated in FIG. 2.

Figure 5:
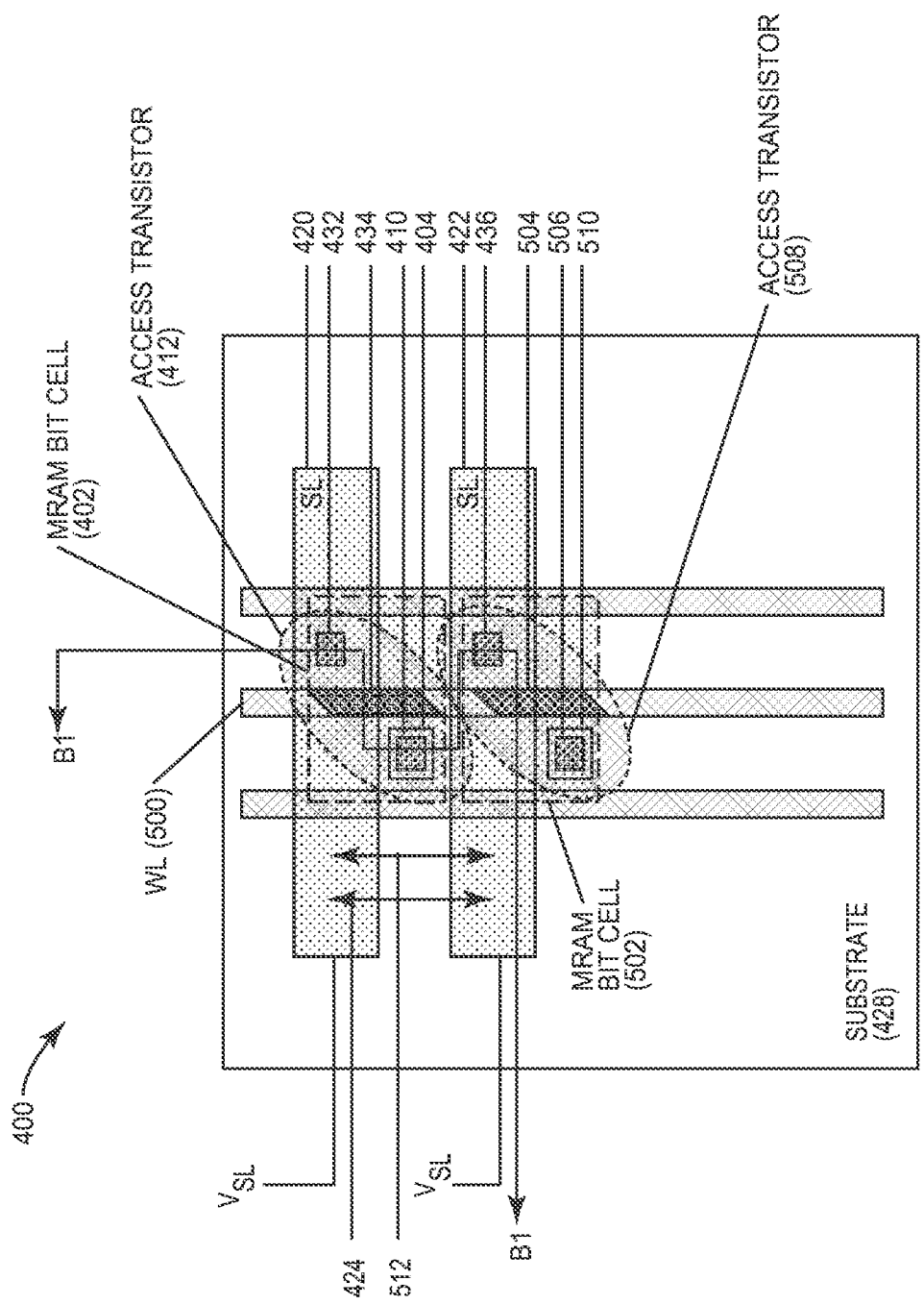
FIG. 5 is a top view of the layout of the exemplary MRAM bit cell illustrated in FIG. 4.

To further illustrate exemplary aspects, FIG. 5 is a top view of the layout 400 of the MRAM bit cell 402 illustrated in FIG. 4. In particular, FIG. 5 illustrates the B1-B1 cross section line corresponding to the side view provided in FIG. 4. Accordingly, any elements described with reference to FIG. 4 will not be re-described with respect to FIG. 5. In this regard, FIG. 5 illustrates a word line (WL) 500 and elements of an adjacent MRAM bit cell 502 disposed on the substrate 428. In particular, FIG. 5 illustrates the source 436, a gate 504, and a drain 506 of an access transistor 508 of the adjacent MRAM bit cell 502. The interconnection line 422 provides the source line (SL) to the MRAM bit cell 502, and a high aspect ratio via 510 interconnects an MTJ (not shown) to the drain 506 of the MRAM bit cell 502. FIG. 5 further illustrates the interconnection line pitch 424 between the interconnection line 420 and the interconnection line 422. Accordingly, the high aspect ratio via 404 of the exemplary MRAM bit cell 402 provides an MRAM bit cell pitch 512 that can be the interconnection line pitch 424. Therefore, the layout 400 allows up to twice as many MRAM bit cells 402, 502 to be disposed on the substrate 428 than the layout 200 illustrated in FIG. 2.

Furthermore, in certain aspects, the high aspect ratio via 404 provides a lower resistance between the MTJ 408 and the drain contact 416, thus reducing MRAM bit cell 402 resistance. This can allow for a higher read margin for the MRAM bit cell 402 and/or the use of a lower read current to read the MRAM bit cell 402. In particular, with reference to FIG. 2, the drain column 244 includes the interfaces 248, 250, 252, 254, each of which adds resistance to the drain column 244. Thus, the drain column 244 provides a resistance that can lead to reduced reliability or increased power consumption of semiconductor devices. In particular, this resistance across the drain column 244 may decrease the amount of write current (I) generated across the MTJ 246 for a given voltage source level ($V_{SL}$) at the interconnection line 232 (i.e., write current (I)=(($V_{SL}$)–bit line voltage ($V_{BL}$))/ resistance). A reduction in the write current (I) margin can lead to reduced write performance of the MRAM bit cell 202 and yield loss. Although increasing the voltage source level ($V_{SL}$) at the interconnection line 232 may counter the decrease in the write current (I) caused by the resistance of the drain column 244, increasing the voltage source level ($V_{SL}$) increases power consumption, which may be undesirable. Also, in many chip designs, it may not be possible to increase the voltage source level ($V_{SL}$) because the corresponding voltage source ($V_S$) is reduced in accordance with general semiconductor technology scaling, for example, to maintain gate dielectric integrity and to reduce overall power consumption in the chip. The high aspect ratio via 404, on the other hand, does not include the interfaces 248, 250, 252, 254. Instead, the high aspect ratio via 404 is formed whole by a conductive material. Accordingly, the high aspect ratio via 404 in FIG. 4 can provide the MRAM bit cell 402 with a higher read margin compared to the MRAM bit cell 202 in FIG. 2. Furthermore, the high aspect ratio via 404 in FIG. 4 can provide the MRAM bit cell 402 with a lower read current to read the MRAM bit cell 402 compared to the MRAM bit cell 202 in FIG. 2.

Figure 6:
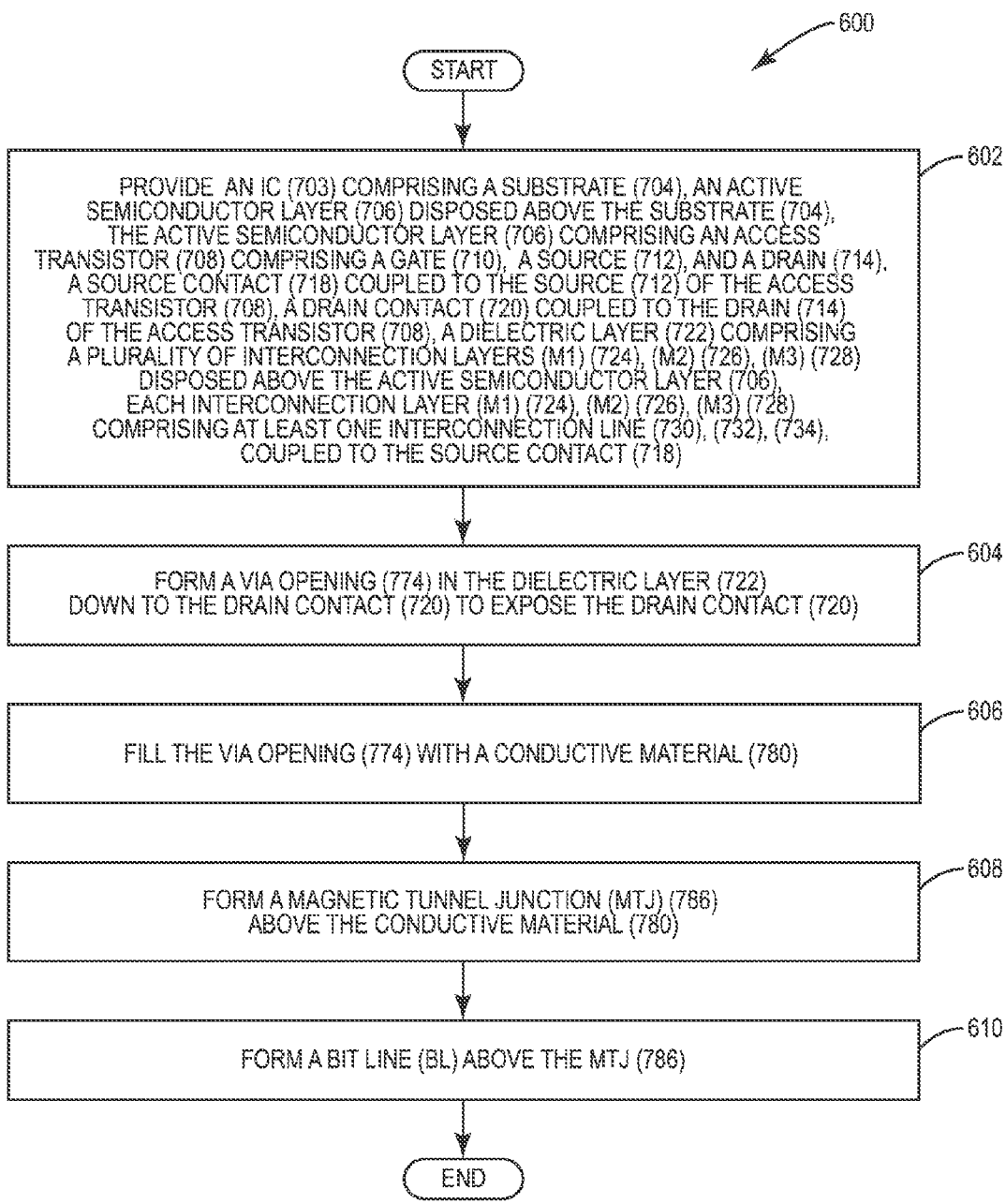
FIG. 6 is a flowchart illustrating an exemplary process for manufacturing an exemplary MRAM bit cell including a high aspect ratio via interconnection to provide a high density MRAM bit cell that can be provided in an MRAM array in an IC.
Figure 7A:
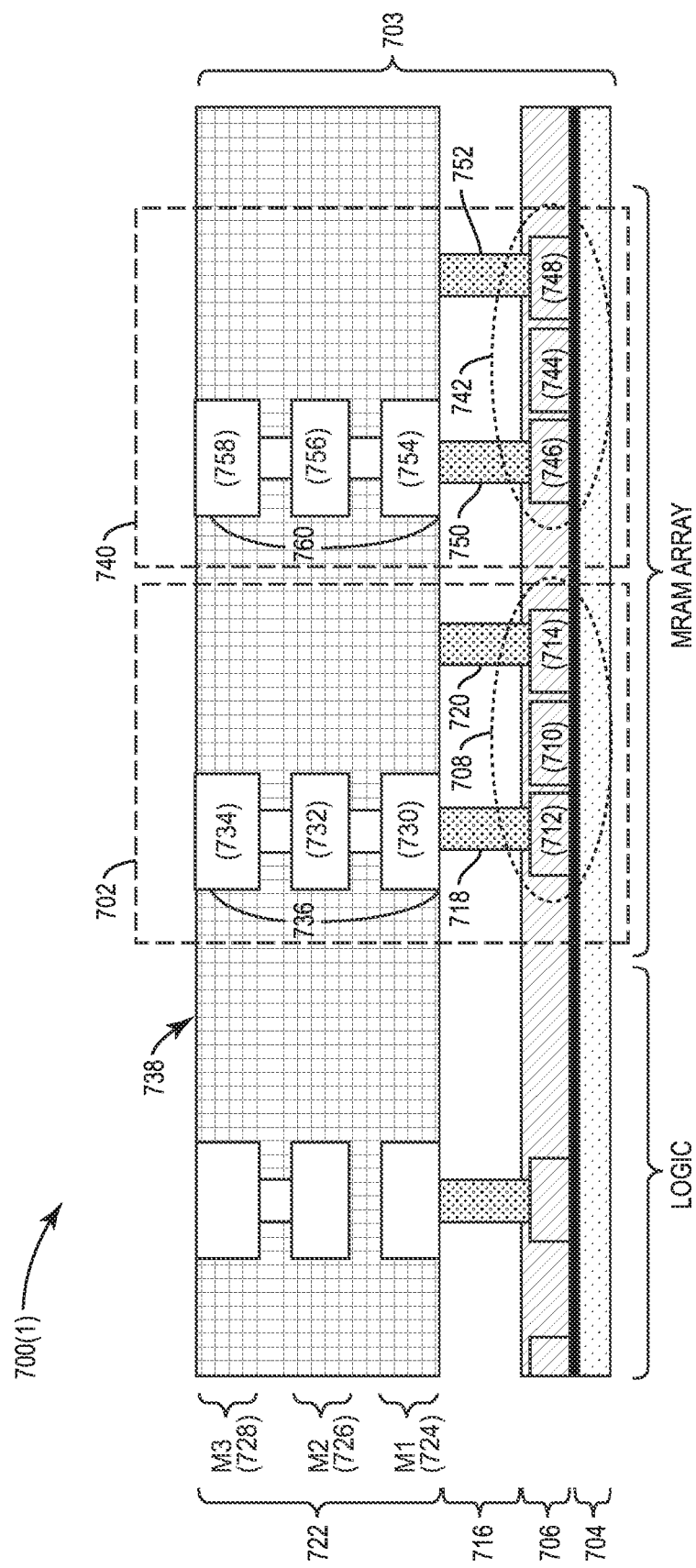
FIGS. 7A-7O are cross-sectional diagrams of an exemplary MRAM illustrating aspects of the exemplary process for fabricating the exemplary MRAM bit cell illustrated in FIGS. 4 and 5.

FIG. 6 is a flowchart illustrating an exemplary process 600 of fabricating an exemplary MRAM bit cell including a high aspect ratio via. The process steps in the process 600 are illustrated respectively in FIGS. 7A-7O. FIGS. 7A-7O will be referenced as the exemplary steps in the process 600 in FIG. 6 are described below.

In this regard, FIG. 7A illustrates a stage 700(1) for fabricating an exemplary MRAM bit cell 702 in an IC 703. In the stage 700(1), the IC 703 is provided, comprising a substrate 704 and an active semiconductor layer 706 disposed above the substrate 704. The active semiconductor layer 706 comprises an access transistor 708, comprising a gate 710, a source 712, and a drain 714. The IC 703 further comprises a contact layer 716 comprising a source contact 718 coupled to the source 712 of the access transistor 708, and a drain contact 720 coupled to the drain 714 of the access transistor 708. The IC 703 further comprises a dielectric layer 722 comprising a plurality of interconnection layers, including a first metal interconnection layer (M1) 724, a second metal interconnection layer (M2) 726, and a third metal interconnection layer (M3) 728, disposed above the active semiconductor layer 706. Each of the metal interconnection layers (M1) 724, (M2) 726, (M3) 728 comprises at least one interconnection line. For example, the first metal interconnection layer (M1) 724 comprises an interconnection line 730, the second metal interconnection layer (M2) 726 comprises an interconnection line 732, and the third metal interconnection layer (M3) 728 comprises an interconnection line 734. The interconnection line 730 is coupled to the source contact 718, and thus serves as a source line (SL) of the MRAM bit cell 702 (block 602). In this example, interconnection lines 730, 732, 734 of the metal interconnection layers (M1) 724, (M2) 726, (M3) 728, respectively, form a source interconnection column 736 interconnecting the source contact 718 to a top surface 738 of the dielectric layer 722. It is noted that the interconnection lines 730, 732, 734 disposed in the metal interconnection layers (M1) 724, (M2) 726, (M3) 728 may be formed, for example, with a dual damascene fill process and may be made from any conductive material desired, including but not limited to copper, tungsten, cobalt, ruthenium, and aluminum or a hybrid or alloy thereof. Employing non-copper metals such as cobalt, ruthenium, and aluminum, for example, may be advantageous for forming the interconnection lines 730, 732, 734 as they are easier materials to be etched back when necessary.

With continued reference to FIG. 7A, a logic section (LOGIC) is illustrated to show that additional semiconductor elements and/or devices may be fabricated adjacent to the MRAM bit cell 702. However, elements of the LOGIC section will only be referenced when relevant to describe a step of the exemplary process 600 of fabricating the MRAM bit cell 702. Furthermore, FIG. 7A illustrates an MRAM bit cell 740 adjacent to the MRAM bit cell 702 to illustrate that the MRAM bit cell 702 may be comprised in an MRAM bit cell array (MRAM ARRAY). The MRAM bit cell 740 includes an access transistor 742 comprising a gate 744, a source 746, and a drain 748. The MRAM bit cell 740 further comprises a source contact 750 coupled to the source 746 of the access transistor 742, and a drain contact 752 coupled to the drain 748 of the access transistor 742. The MRAM bit cell 740 further comprises an interconnection line 754 in the first interconnection layer (M1) 724, the interconnection line 754 coupled to the source contact 750, thus functioning as a source line (SL) of the MRAM bit cell 740. In this example, interconnection lines 754, 756, 758 of the metal interconnection layers (M1) 724, (M2) 726, (M3) 728, respectively, form a source interconnection column 760 interconnecting the source contact 750 to the top surface 738 of the dielectric layer 722.

It is noted that, although FIGS. 7A-7O illustrate the fabrication of the adjacent MRAM bit cell 740 alongside the fabrication of the MRAM bit cell 702, elements of the MRAM bit cell 740 will only be referenced when relevant to describe a step of the exemplary process 600 of fabricating the MRAM bit cell 702. Furthermore, the metal interconnection layers (M1) 724, (M2) 726, (M3) 728 are illustrated as an example, but the dielectric layer 722 may include more or fewer interconnection layers.

Figure 7B:
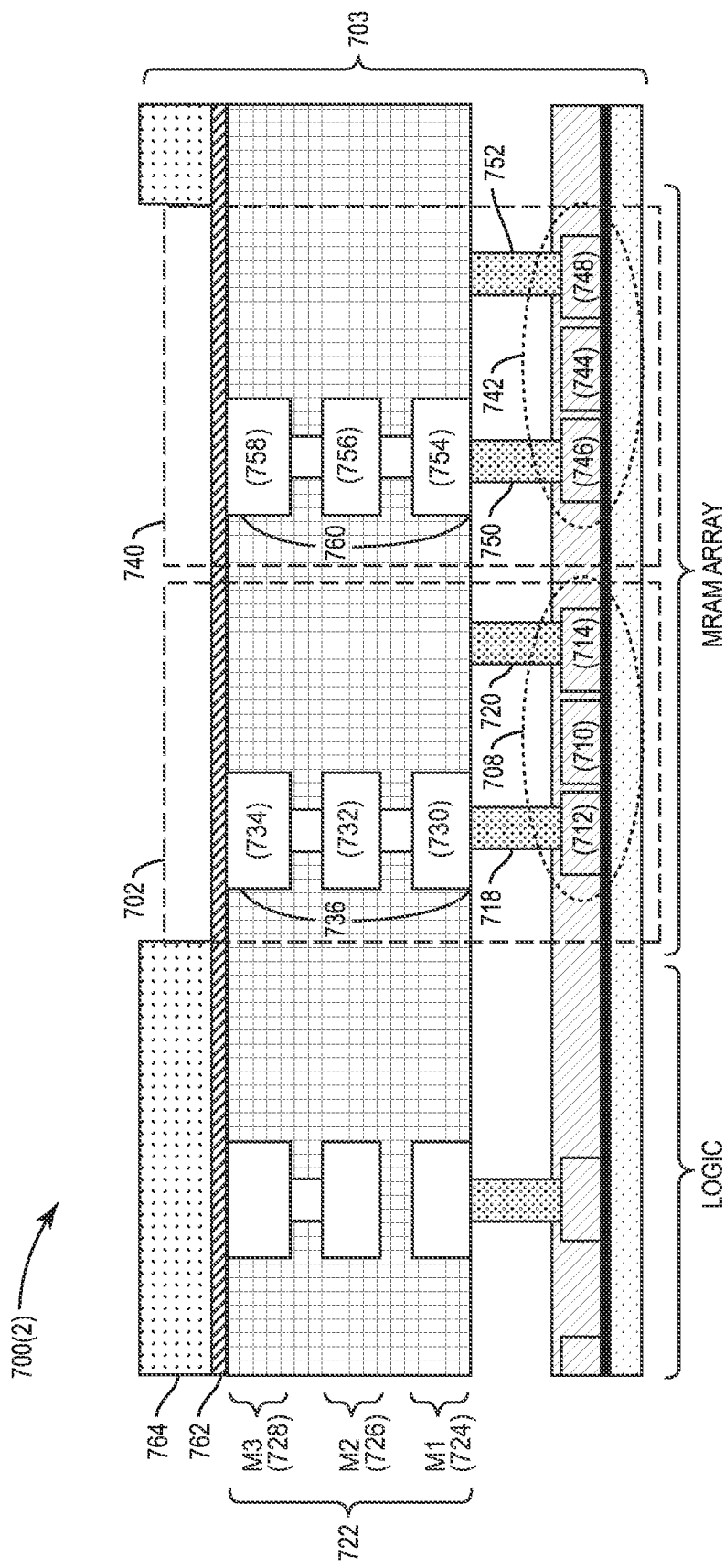

A next exemplary fabrication step is to form a via opening in the dielectric layer 722 down to the drain contact 720 to expose the drain contact 720 (block 604). In this regard, FIG. 7B illustrates a stage 700(2) for fabricating the exemplary MRAM bit cell 702 in the IC 703. A lithography process is employed to form a capping layer 762 to protect, for example, the LOGIC section from later fabrication steps of the exemplary process 600. In this regard, the capping layer 762 is first deposited on top of the dielectric layer 722. The capping layer 762 comprises a dielectric material (e.g., Silicon Carbon Nitride (SiCN), or Silicon Nitride (SiN)). A photoresist layer 764 is then disposed on the capping layer 762 to provide a masking pattern for the capping layer 762.

Figure 7C:
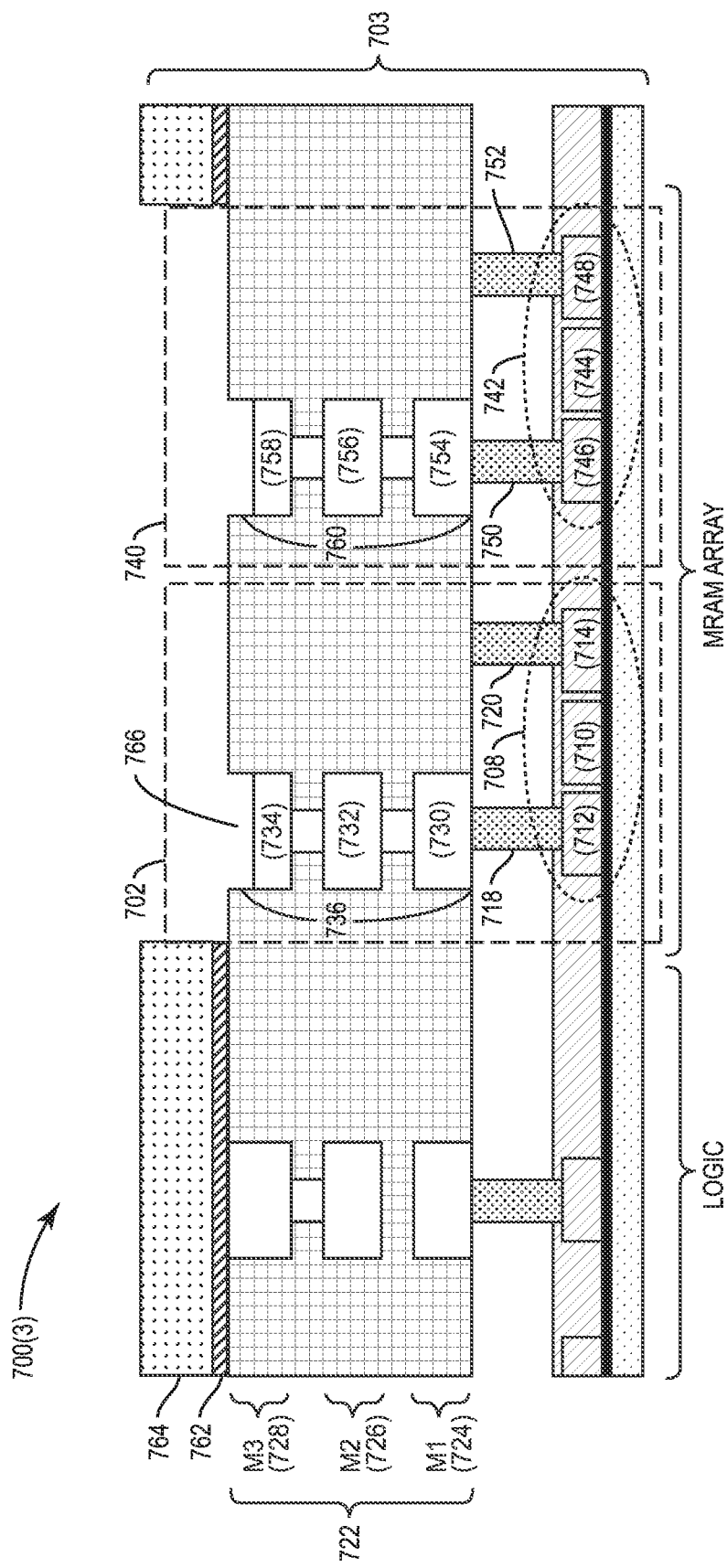

FIG. 7C illustrates a stage 700(3) for fabricating the exemplary MRAM bit cell 702 in the IC 703. The next step to form the via opening in the dielectric layer 722 down to the drain contact 720 to expose the drain contact 720 is to remove a portion of the capping layer 762 that is not protected by the photoresist layer 764 to expose a portion of the dielectric layer 722 above the MRAM ARRAY section. This allows for the LOGIC section to be protected from later steps of the process 600. Furthermore, an optional step of forming a recess 766 in the interconnection line 734 is performed by removing a portion of the interconnection line 734. As will be described below, this recess 766, in combination with a dielectric material (not shown), reduces the possibility of a coupling of the interconnection line 734, and thus of the source interconnection column 736, with an adjacent coupling column formed in later steps. The recess 766 can be formed by, for example, reactive-ion etching (RIE, described in, for example, U.S. Pat. No. 7,153,775 to Geusic et al., which is incorporated by reference herein in its entirety) or wet etching (described in, for example, U.S. Pat. No. 8,372,757 to Meyer et al., which is incorporated by reference herein in its entirety). As noted earlier, this step is optional, as the process 600 may allow sufficient isolation between the interconnection line 734 and the adjacent coupling column formed in later steps to render the recess 766 unnecessary.

Figure 7D:
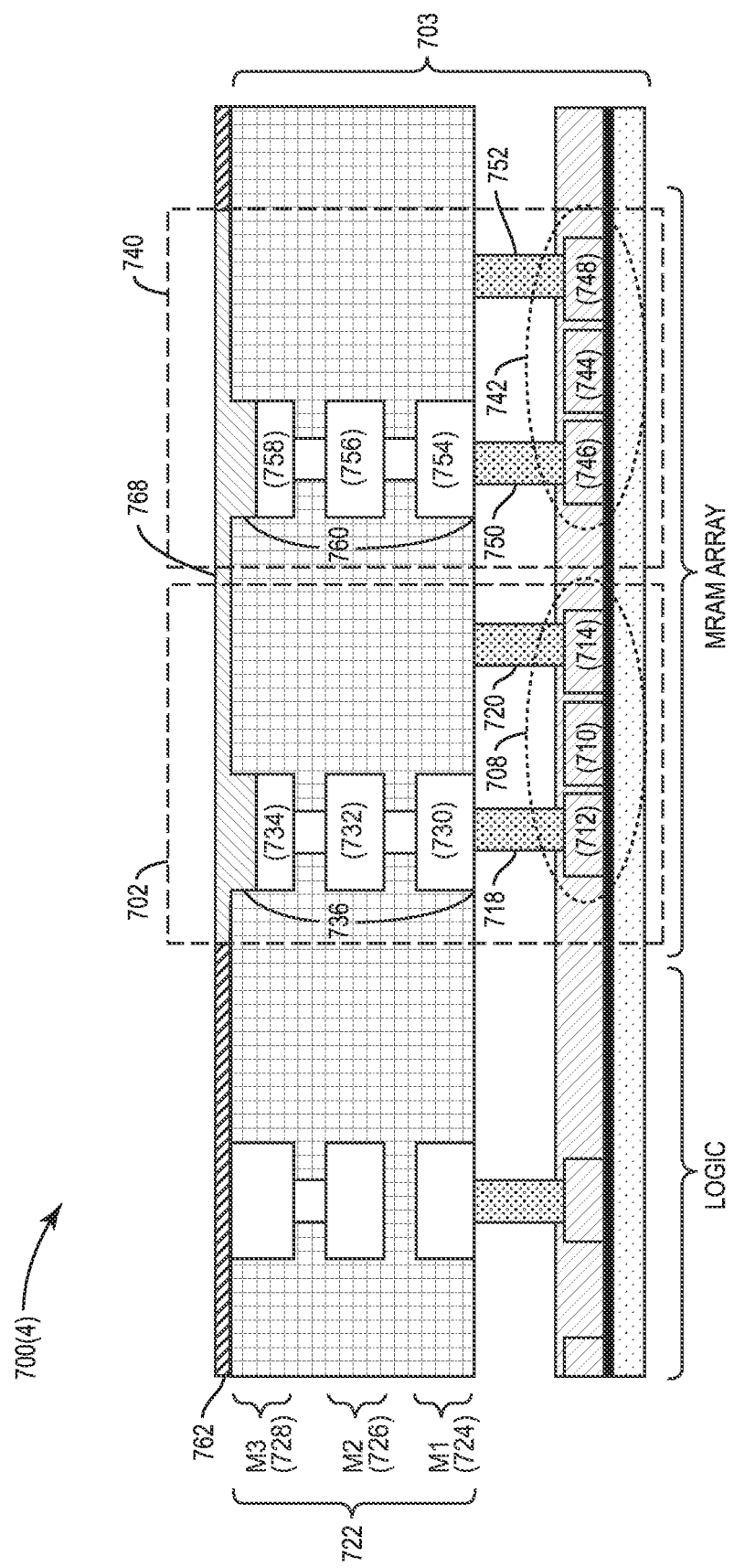

FIG. 7D illustrates a stage 700(4) for fabricating the exemplary MRAM bit cell 702 in the IC 703. The next step to form the via opening in the dielectric layer 722 down to the drain contact 720 to expose the drain contact 720 is an optional step comprising stripping the photoresist layer 764 and depositing a dielectric material 768 above the MRAM ARRAY area to fill the recess 766 etched over the interconnection line 734. The dielectric material 768 may be, for example, SiCN or SiN. The dielectric material 768 is then polished to provide a flush surface with the capping layer 762 using, for example, chemical-mechanical planarization (CMP). It is noted that this step is optional because it is performed to fill the optional recess 766 in the interconnection line 734. Thus, this step is performed when the optional step illustrated in FIG. 7C of forming the recess 766 in the interconnection line 734 is performed.

FIGS. 7E and 7F illustrates side and top views of a stage 700(5) for fabricating the exemplary MRAM bit cell 702 in the IC 703. Specifically, FIG. 7E is a side view across layer C1-C1 in FIG. 7F, and FIG. 7F is a top view across layer E1-E1 in FIG. 7E. The next step to form the via opening in the dielectric layer 722 down to the drain contact 720 to expose the drain contact 720 is to deposit a photoresist layer 770 on the capping layer 762 to provide a masking pattern to etch a via opening in the dielectric layer 722 in a later step. In particular, the photoresist layer 770 leaves open areas 772 in FIG. 7F to allow etching therein.

FIGS. 7G and 7H illustrate side and top views of a stage 700(6) for fabricating the exemplary MRAM bit cell 702 in the IC 703. Specifically, FIG. 7G is a side view across layer C2-C2 in FIG. 7H, and FIG. 7H is a top view across layer E2-E2 in FIG. 7G. The next step to form the via opening in the dielectric layer 722 down to the drain contact 720 to expose the drain contact 720 is to remove a portion of the dielectric layer 722 that is not protected by the photoresist layer 770, illustrated in FIG. 7E, above the MRAM ARRAY section to form a via opening 774 and expose the drain contact 720. Furthermore, the photoresist layer 770 is stripped.

FIGS. 7I and 7J illustrate side and top views of a stage 700(7) for fabricating the exemplary MRAM bit cell 702 in the IC 703. Specifically, FIG. 7I is a side view across layer C3-C3 in FIG. 7J, and FIG. 7J is a top view across layer E3-E3 in FIG. 7I. The next step is an optional step of forming dielectric spacer layers 776, 778 by depositing a dielectric spacer material, e.g., SiN, in the via opening 774 and etching out a portion of the dielectric spacer material using directional etching. This provides further isolation between the interconnection line 734 and a high aspect ratio via that will be deposited in the via opening 774 in later steps. It is noted that this step is optional, as the fabrication process may allow sufficient isolation between the interconnection line 734 and the adjacent coupling column formed in the later steps to render the dielectric spacer layers 776, 778 unnecessary.

Figure 7L:
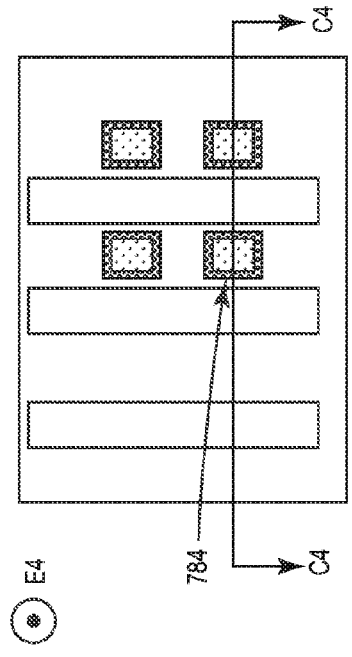
Figure 7K:
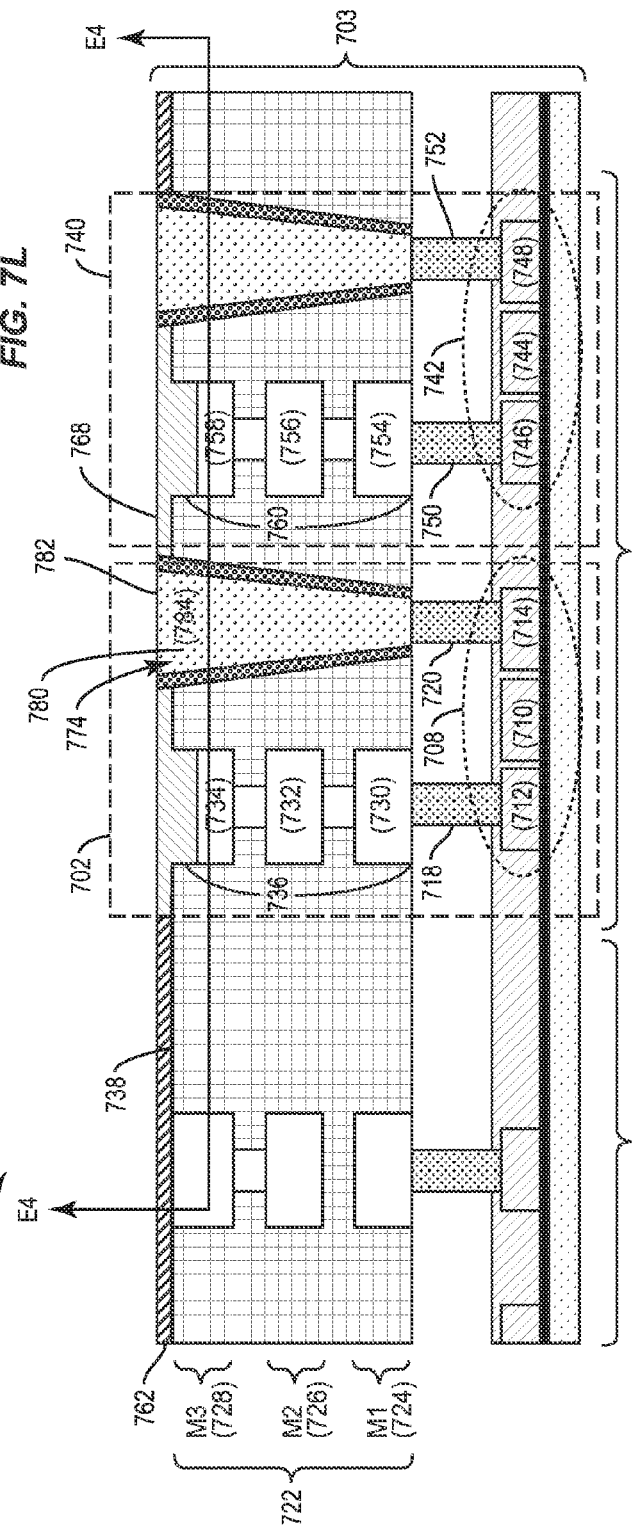

A next exemplary fabrication step is to fill the via opening 774 with a conductive material 780 (block 606). In this regard, FIGS. 7K and 7L illustrate side and top views of a stage 700(8) for fabricating the exemplary MRAM bit cell 702 in the IC 703. Specifically, FIG. 7K is a side view across layer C4-C4 in FIG. 7L, and FIG. 7L is a top view across layer E4-E4 in FIG. 7K. The step to fill the via opening 774 with the conductive material 780 may include a selective metal growth. The conductive material 780 can be Cobalt, for example, and can be grown by chemical vapor deposition (CVD) or electroless deposition (ELD), for example. A next step is to planarize a top surface 782 of the conductive material 780 by chemical-mechanical planarization (CMP), for example, and form a via 784. In FIG. 7K, the via 784 is shown flush with the capping layer 762. Accordingly, any element landing or contacting the via 784 will land or contact the via 784 at the level of the capping layer 762. In an optional aspect, the capping layer 762 may be removed by an etching process and the via 784 may be further planarized by CMP, for example, to be flush with the top surface 738 of the dielectric layer 722. This will result in the via 784 having a "zero height" relative to the top surface 738 of the dielectric layer 722, and to the metal interconnection layer (M3) 728, in this example.

A next step is to form an MTJ 786 above the conductive material 780 forming the via 784 (block 608). In this regard, FIGS. 7M and 7N illustrate side views of a stage 700(9) for fabricating the exemplary MRAM bit cell 702 in the IC 703. FIG. 7N, in particular, is a side view providing additional detail of an MTJ 786. The MTJ 786 includes a first end electrode 788 and a second end electrode 790. The MTJ 786, in particular the first end electrode 788, is disposed on the via 784. The MTJ 786 is formed through application of a metal hard mask (MHM), and a lithography and etch process.

A next step is to form a bit line (BL) above the MTJ 786 for fabricating the exemplary MRAM bit cell 702. In this regard, FIG. 7O illustrates a stage 700(10) for fabricating the exemplary MRAM bit cell 702 in the IC 703. In particular, an interconnection line 792 of a fourth metal interconnection layer (M4) 794 is disposed on the MTJ 786 to provide a bit line (BL) therein.

The high aspect ratio via interconnections in magnetic random access memory (MRAM) bit cells according to aspects disclosed herein may be provided in or integrated into any processor-based device. Examples, without limitation, include a set top box, an entertainment unit, a navigation device, a communications device, a fixed location data unit, a mobile location data unit, a mobile phone, a cellular phone, a smart phone, a tablet, a phablet, a computer, a portable computer, a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, a medical device, and an automobile.

Figure 8:
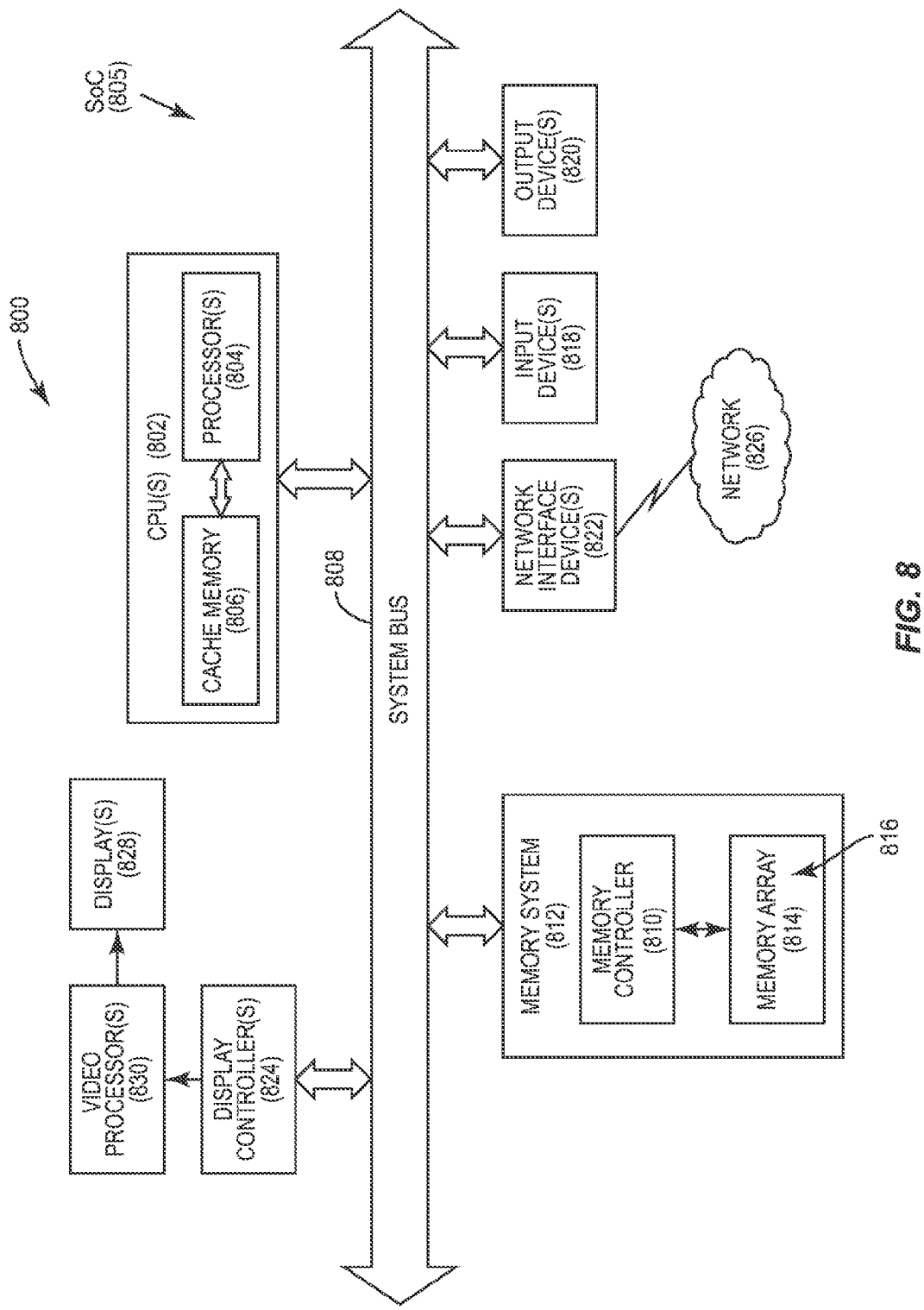
FIG. 8 is a block diagram of an exemplary processor-based system that can include the MRAM bit cell of FIGS. 4 and 5.

In this regard, FIG. 8 illustrates an example of a processor-based system 800 that can include MRAM bit cells including high aspect ratio via interconnections to provide high density MRAM according to any of the particular aspects discussed above. In this example, the processor-based system 800 includes one or more CPUs 802, each including one or more processors 804. The processor-based system 800 may be provided as a system-on-a-chip (SoC) 805. The CPU(s) 802 may have cache memory 806 coupled to the processor(s) 804 for rapid access to temporarily stored data. The CPU(s) 802 is coupled to a system bus 808 and can intercouple master and slave devices included in the processor-based system 800. As is well known, the CPU(s) 802 communicates with these other devices by exchanging address, control, and data information over the system bus 808. For example, the CPU(s) 802 can communicate bus transaction requests to a memory controller 810 in a memory system 812 as an example of a slave device. Although not illustrated in FIG. 8, multiple system buses 808 could be provided, wherein each system bus 808 constitutes a different fabric. In this example, the memory controller 810 is configured to provide memory access requests to a memory array 814 in the memory system 812. The memory array 814 can include MRAM bit cells 816 that employ high aspect ratio via interconnections to provide high density MRAM according to any of the particular aspects discussed above. The cache memory 806 could also include MRAM bit cells that include high aspect ratio via interconnections to provide high density MRAM according to any of the particular aspects discussed above.

Other devices can be connected to the system bus 808. As illustrated in FIG. 8, these devices can include the memory system 812, one or more input devices 818, one or more output devices 820, one or more network interface devices 822, and one or more display controllers 824, as examples. The input device(s) 818 can include any type of input device, including but not limited to input keys, switches, voice processors, etc. The output device(s) 820 can include any type of output device, including but not limited to audio, video, other visual indicators, etc. The network interface device(s) 822 can be any devices configured to allow exchange of data to and from a network 826. The network 826 can be any type of network, including but not limited to a wired or wireless network, a private or public network, a local area network (LAN), a wireless local area network (WLAN), a wide area network (WAN), a BLUETOOTH™ network, and the Internet. The network interface device(s) 822 can be configured to support any type of communications protocol desired.

The CPU(s) 802 may also be configured to access the display controller(s) 824 over the system bus 808 to control information sent to one or more displays 828. The display controller(s) 824 sends information to the display(s) 828 to be displayed via one or more video processors 830, which process the information to be displayed into a format suitable for the display(s) 828. The display(s) 828 can include any type of display, including but not limited to a cathode ray tube (CRT), a liquid crystal display (LCD), a plasma display, etc.

Those of skill in the art will further appreciate that the various illustrative logical blocks, modules, circuits, and algorithms described in connection with the aspects disclosed herein may be implemented as electronic hardware, instructions stored in memory or in another computer-readable medium and executed by a processor or other processing device, or combinations of both. The master and slave devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flow chart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A magnetic random access memory (MRAM) bit cell, comprising:
   a substrate;
   an active semiconductor layer disposed above the substrate, the active semiconductor layer comprising an access transistor, the access transistor comprising a gate, a source, and a drain;
   a source contact coupled to the source of the access transistor;
   a drain contact coupled to the drain of the access transistor;
   a dielectric layer comprising a plurality of interconnection layers disposed above the active semiconductor layer, each interconnection layer comprising at least one interconnection line;
   a source line comprising an interconnection line of a first interconnection layer of the plurality of interconnection layers, the source line coupled to the source contact; and
   a magnetic tunnel junction (MTJ) coupling column disposed across at least two interconnection layers of the plurality of interconnection layers between the drain contact and an MTJ, the MTJ coupling column comprising a vertical interconnect access (via) coupling a first end electrode of the MTJ to the drain contact without coupling to any interconnection lines in the at least two interconnection layers;
   the MTJ comprising a tunnel junction disposed between the first end electrode and a second end electrode; and
   a bit line comprising an interconnection line of a second interconnection layer of the plurality of interconnection layers, the bit line coupled to the second end electrode of the MTJ.

2. The MRAM bit cell of claim 1, further comprising a dielectric spacer layer disposed around the via.

3. The MRAM bit cell of claim 1, wherein the via has a height-to-width aspect ratio of at least 10 (ten).

4. The MRAM bit cell of claim 1, wherein the first interconnection layer of the plurality of interconnection layers comprises a plurality of interconnection lines;
   wherein the via is disposed between a first interconnection line of the plurality of interconnection lines and a second interconnection line of the plurality of interconnection lines; and
   wherein the second interconnection line is adjacent to the first interconnection line and separated from the first interconnection line by at least an interconnection line pitch of the plurality of interconnection lines.

5. The MRAM bit cell of claim 1, wherein the via comprises a top end and a bottom end, the bottom end connected to the drain contact and the top end connected to the MTJ.

6. The MRAM bit cell of claim 1, wherein:
   the bit line is configured to receive a read voltage; and
   the source line is configured to receive a source read voltage.

7. The MRAM bit cell of claim 1, wherein:
   the bit line is configured to receive a write voltage; and
   the source line is configured to receive a source write voltage.

8. The MRAM bit cell of claim 1, wherein the access transistor comprises an n-type metal oxide semiconductor (MOS) (NMOS) transistor.

9. The MRAM bit cell of claim 1 integrated into an integrated circuit (IC).

10. The MRAM bit cell of claim 1 integrated into a device selected from the group consisting of: a set top box; an entertainment unit; a navigation device; a communications device; a fixed location data unit; a mobile location data unit; a mobile phone; a cellular phone; a smart phone; a tablet; a phablet; a computer; a portable computer; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; a medical device; and an automobile.

11. A magnetic random access memory (MRAM) bit cell array, comprising:
   a plurality of MRAM bit cells, each MRAM bit cell comprising:
   a substrate;

an active semiconductor layer disposed above the substrate, the active semiconductor layer comprising an access transistor, the access transistor comprising a gate, a source, and a drain;

a source contact coupled to the source of the access transistor;

a drain contact coupled to the drain of the access transistor;

a dielectric layer comprising a plurality of interconnection layers disposed above the active semiconductor layer, each interconnection layer comprising at least one interconnection line;

a source line comprising an interconnection line of a first interconnection layer of the plurality of interconnection layers, the source line coupled to the source contact; and a magnetic tunnel junction (MTJ) coupling column disposed across at least two interconnection layers of the plurality of interconnection layers between the drain contact and an MTJ, the MTJ coupling column comprising a vertical interconnect access (via) coupling a first end electrode of the MTJ to the drain contact without coupling to any interconnection lines in the at least two interconnection layers;

the MTJ comprising a tunnel junction disposed between the first end electrode and a second end electrode; and a bit line comprising an interconnection line of a second interconnection layer of the plurality of interconnection layers, the bit line coupled to the second end electrode of the MTJ, wherein a via of a first MRAM bit cell of the plurality of MRAM bit cells is disposed between a source line of the first MRAM bit cell of the plurality of MRAM bit cells and a source line of a second MRAM bit cell of the plurality of MRAM bit cells disposed adjacent to the first MRAM bit cell; and wherein the source line of the first MRAM bit cell and the source line of the second MRAM bit cell are separated by an interconnection line pitch.

12. The MRAM bit cell array of claim 11, wherein the via of the first MRAM bit cell has a height-to-width aspect ratio of at least 10 (ten).

13. The MRAM bit cell array of claim 11, wherein the via of the first MRAM bit cell comprises a top end and a bottom end, the bottom end connected to a drain contact of the first MRAM bit cell and the top end connected to an MTJ of the first MRAM bit cell.

14. The MRAM bit cell array of claim 11, wherein each MRAM bit cell among the plurality of MRAM bit cells further comprises a dielectric spacer layer disposed around the via.

15. The MRAM bit cell array of claim 11, wherein, for each MRAM bit cell among the plurality of MRAM bit cells:
the first interconnection layer of the plurality of interconnection layers comprises a plurality of interconnection lines;
the via is disposed between a first interconnection line of the plurality of interconnection lines and a second interconnection line of the plurality of interconnection lines; and
the second interconnection line is adjacent to the first interconnection line and separated from the first interconnection line by at least an interconnection line pitch of the plurality of interconnection lines.

16. The MRAM bit cell array of claim 11, wherein, for each MRAM bit cell among the plurality of MRAM bit cells:
the bit line is configured to receive a read voltage; and
the source line is configured to receive a source read voltage.

17. The MRAM bit cell array of claim 11, wherein, for each MRAM bit cell among the plurality of MRAM bit cells:
the bit line is configured to receive a write voltage; and
the source line is configured to receive a source write voltage.

18. The MRAM bit cell array of claim 11, wherein the access transistor in each MRAM bit cell among the plurality of MRAM bit cells comprises an n-type metal oxide semiconductor (MOS) (NMOS) transistor.

19. The MRAM bit cell array of claim 11 integrated into an integrated circuit (IC).

20. MRAM bit cell array of claim 11 integrated into a device selected from the group consisting of: a set top box; an entertainment unit; a navigation device; a communications device; a fixed location data unit; a mobile location data unit; a mobile phone; a cellular phone; a smart phone; a tablet; a phablet; a computer; a portable computer; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; a medical device; and an automobile.

* * * * *